(12) United States Patent  (10) Patent No.: US 6,838,941 B2
Yamamoto et al.  (45) Date of Patent: Jan. 4, 2005

(54) MULTI-BAND POWER AMPLIFIER

(75) Inventors: Kazuya Yamamoto, Hyogo (JP); Satoshi Suzuki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/309,239

(22) Filed: Dec. 4, 2002

(65) Prior Publication Data

US 2003/0117219 A1 Jun. 26, 2003

(30) Foreign Application Priority Data

Dec. 5, 2001 (JP) ........................................ 2001-371206

(51) Int. Cl.⁷ ................................................ H03F 3/68
(52) U.S. Cl. .................................... 330/295; 330/124 R
(58) Field of Search ............................. 330/53, 124 R, 330/286, 295

(56) References Cited

U.S. PATENT DOCUMENTS 6,151,509 A  11/2000  Chorey
6,201,445 B1 *  3/2001  Morimoto et al. .......... 330/295
6,232,840 B1 *  5/2001  Teeter et al. ................ 330/295
6,545,542 B2 *  4/2003  Matsuyoshi et al. ........ 330/301

FOREIGN PATENT DOCUMENTS

| EP | 1 035 657 | 9/2000 |
| JP | 61-51754 | 4/1986 |
| JP | P2001-68556 A | 3/2001 |
| JP | P2001-102460 A | 4/2001 |

\* cited by examiner

*Primary Examiner*—Khanh Van Nguyen
(74) *Attorney, Agent, or Firm*—McDermott Will & Emery LLP

(57) ABSTRACT

A final-stage power amplification transistor is formed of unit transistors arranged in a mixed manner in a region in which the final output amplification transistors for a multi-band power amplifier is formed. Furthermore, an inductance element is connected between output signal lines to which the final output stage transistors are coupled. Thus, the final-stage transistors in a dual band power amplifier can be made free from current concentration due to heat generation without impairing inter-band isolation.

12 Claims, 15 Drawing Sheets

FIG.10
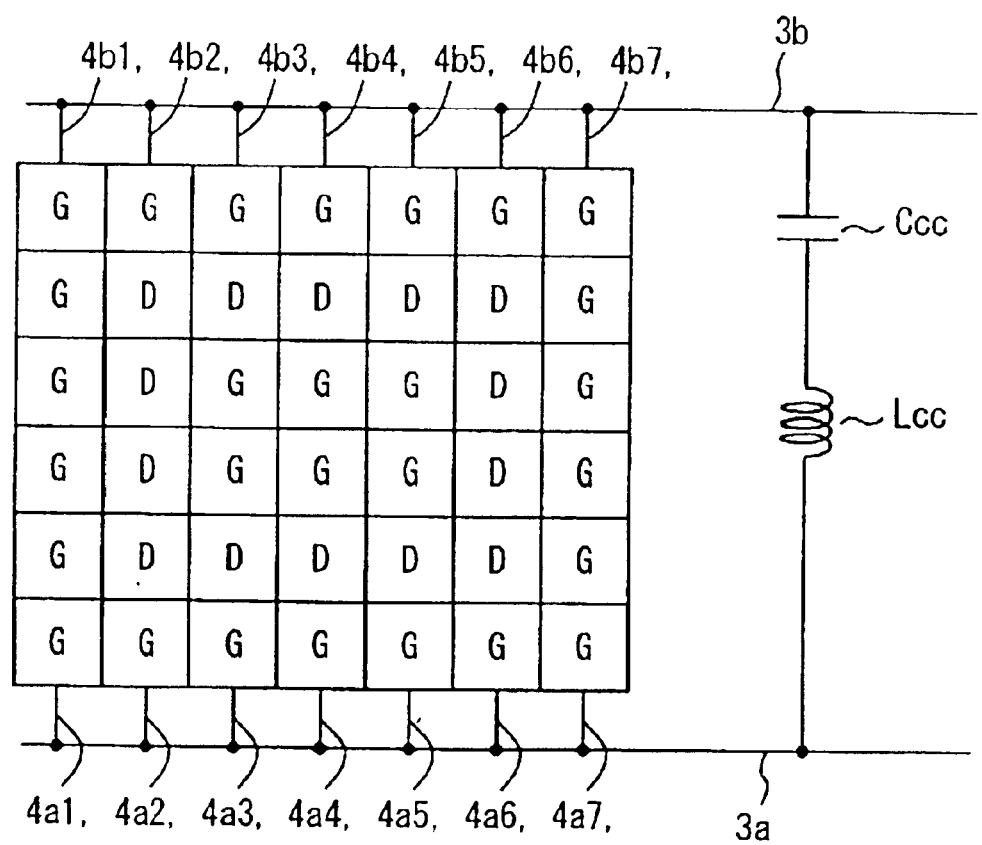
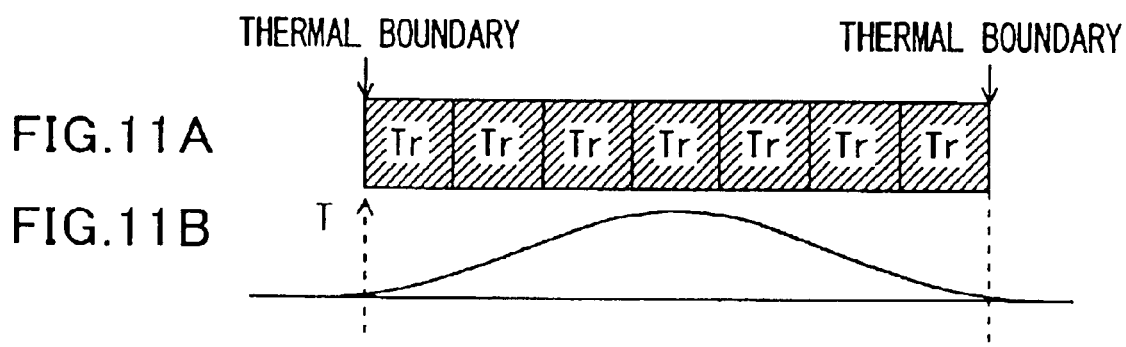
FIG.11A
FIG.11B

UNIFORM TEMPERATURE WITHOUT HEAT DISTRIBUTION

MULTI-BAND POWER AMPLIFIER

BACKGROUND OF THE INVENTION

1. Field of the Invention

The present invention relates generally to amplifiers and particularly to configurations of power amplifiers for multi-bands, such as dual bands or triple bands. More specifically, the present invention relates to configurations for preventing degradation of transistor characteristics of a multi-band power amplifier without deterioration of communication quality or increase in chip size.

2. Description of the Background Art

For power amplifiers for mobile communications, there are currently, commonly used a MMIC (monolithic microwave IC) or module (hybrid IC or multi-chip module) using a GaAs MESFET (metal-semiconductor filed effect transistor), a GaAs HEMT (high electron mobility transistor), or a GaAs HBT (hetero junction bipolar transistor). Of these transistors, a GaAs-HBT or a SiGe-HBT utilizing a hetero junction of gallium arsenide (GaAs) or of silicon germanium (SiGe) is currently most promising power devices for mobile communications, because they are more advantageous than a conventional field effect transistor (FET), in the following points:

(1) A negative gate bias voltage is not required and a single power supply operation can be achieved;

(2) Similarly to a Si-MOSFET (an insulated gate field effect transistor), no analog switch on the drain (or collector) side is required to perform an on/off operation to the output; and (3) An output power density is very high and a prescribed output can be obtained with a power amplifier smaller in size than a FET power amplifier.

A representative application of mobile communication is a mobile phone system. The mobile phone system includes the European Global System For Mobile Communications (GSM), a currently most widely used, 900 MHz-band mobile phone system, and the Digital Cordless Systems (DCS), a 1800 MHz-band mobile phone system widely used in Europe. In the GSM, DCS and other communication systems, a mobile phone of a high output of 1W to 4W is employed and a Si-MOSFET power amplifier, a main stream power amplifier for the mobile phone, is being replaced by a power amplifier making use of advantageous features of an HBT (an HBT power amplifier).

FIG. 14 schematically shows a configuration of a conventional GSM-DCS dual-band power amplification circuit. In FIG. 14, the dual-band power amplification circuit includes a DCS power amplifier 900 receiving a DCS signal IN_DCS and a bias voltage Vdcc to generate an output signal OUT_DCS when enabled, a GSM power amplifier 902 receiving an input signal IN_GSM and a bias voltage Vgcc and amplifying input signal IN_GSM to generate an output signal OUT_GSM when enabled, and a bias switch 904 for enabling one of DCS power amplifier 900 and GSM power amplifier 902 and also controlling a bias voltage of the enabled power amplifier in response to an output control voltage Vpc and a mode select signal Vmod.

Bias control voltage Vpc is generated for each of DCS power amplifier 900 and GSM power amplifier 902, individually.

In this dual-band power amplification circuit, one of DCS power amplifier 900 and GSM power amplifier 902 is enabled under the control of bias switch 904 in response to mode select signal Vmod. Either the output signal OUT_DCS output from DCS power amplifier 900 or the output signal OUT_GSM output from GSM power amplifier 902 is transmitted via a common antenna.

FIG. 15 shows an exemplary configuration of DCS power amplifier 900 shown in FIG. 14. In FIG. 15, DCS power amplifier 900 includes an input matching circuit 911 receiving input signal IN_DCS, a first amplification stage 912 amplifying a signal received through input matching circuit 911, a second amplification stage 914 receiving an output signal from the first amplification stage 912 via an inter-stage coupling circuit 913 to amplify the received signal, a third amplification stage 916 receiving a signal from the second amplification stage 914 via an inter-stage matching circuit 915 to amplify the received signal, and an output matching circuit 917 receiving an output signal from the third amplification stage 916 to generate the output signal OUT_DCS.

Input matching circuit 911 is constructed by a stub, a resistance and a capacitance element, and matches an input signal and an input impedance of power amplifier 900. Amplification stages 912, 914 and 916 receive collector bias voltages Vdc1, Vdc2 ad Vdc3, respectively. Amplification stages 912, 914 and 916 each include hetero-junction bipolar transistors (HBTs), as a power amplification element. Transistors Trd1 to Trd3 receive, at their respective collector nodes, collector bias voltages Vdc1, Vdc2 and Vdc3 via a stabilization circuit formed of a stub and a stabilizing capacitance element.

In amplification stages 912, 914 and 916, collector bias voltages Vdc1, Vdc2 and Vdc3 are applied to the respective collectors of power amplification transistors Trd1 Trd2 and Trd3 through the amplification circuit formed of the stub and the capacitance element, and to stably and quickly change the collector potentials of these transistors in accordance with the base potentials of the respective transistors.

DCS power amplifier 900 further includes a low pass filter 920 receiving DCS bias voltage Vdcc, bias voltage control circuits 921, 924 and 926 for adjusting the base voltages of power amplification transistors Trd1, Trd2 and Trd3 in accordance with bias voltage Vdcc from low pass filter 920 and a base bias control voltage VDCS from bias switch 904 shown in FIG. 14, and a mode switch circuit 922 responsive to mode select signal Vmodd received from bias switch 904 shown in FIG. 17 to selectively fix output bias voltages of bias voltage control circuits 921, 924 and 926 to a ground voltage level. Bias voltage control circuit 921 is formed of a resistance element.

Mode switch circuit 922 includes a switching transistor selectively rendered conductive in response to mode select signal Vmodd, and sets the power amplifier 900 in the in activated state or the in activated state in accordance with the on/off state of the switching transistor.

Mode select signal Vmodd is generated by bias switch 904 in response to mode select signal Vmod shown in FIG. 14. When mode select signal Vmodd is at an H (logical high) level, mode switch circuit 922 has the switching transistor turned on, to set the base voltages of power amplification transistors Trd1, Trd2 and Trd3 to a ground voltage level or a base to emitter voltage level to render power amplification transistors Trd1 to Trd3 non-conductive.

When mode select signal Vmodd is at an L (logical low) level, the switching transistor in mode switch circuit 922 is turned off and bias control voltage VDCS supplied from bias switch 904 is applied via bias voltage control circuit (a resistance element) 921 to the base of the first stage power amplification transistor Trd1. Power amplification transistors Trd2 and Trd3 receive, at their respective bases, bias voltages at a level according to bias voltage Vdcc and bias control voltage VDCS generated by bias voltage control circuits 924 and 926, respectively. In accordance with these base bias voltages, power amplification transistors Trd1, Trd2 and Trd3 each amplify a signal applied from a preceding matching circuit to the base thereof. Amplification stages 914 and 916 have the amplification rates adjusted in accordance with bias control voltage VDCS.

In FIG. 15, a block 930 surrounded by a broken line indicates a portion normally constructed by a single semiconductor chip, and outside the block 930, there are arranged the stub and the capacitance.

Final-stage power amplification transistor Trd3 generates output signal OUT_DCS via output matching circuit 917 and sends out the signal through a subsequent coupler to an antenna. Accordingly, final-stage power amplification transistor Trd3 has a driving capability made sufficiently larger than power amplification transistors Trd1 and Trd2 at the preceding stages. Final-stage power amplification transistor Trd3 has a collector node normally coupled to an externally arranged stub via a pad. An open stub is arranged at an output node and an output capacitance load is adjusted to stabilize a signal output from final-stage amplification stage 916.

FIG. 16 shows an exemplary configuration of GSM power amplifier 904 shown in FIG. 14. Referring to FIG. 16, GSM power amplifier 904 includes an input matching circuit 951 receiving GSM input signal IN_GSM, a first amplification stage 952 amplifying a signal received through input matching circuit 952, a second amplification stage 954 receiving a signal from the first-stage amplification stage 952 through an inter-stage matching circuit 953 to amplify the received signal, a third amplification stage 956 receiving a signal from the second amplification stage 954 through an inter-stage matching circuit 955 to amplify the received signal, and an output matching circuit 957 transmitting a signal received from the third amplification stage 956 to an output node.

The first, second and third amplification stages 952, 954 and 956 include power amplification transistors Trg1, Trg2 and Trg3, respectively. Power amplification transistor Trg1 receives, at a collector, a collector control voltage Vgc1 via a stabilization circuit formed of a stub and a capacitance element. Power amplification transistor Trg2 receives, at a collector, a collector control voltage Vgc2 via a stabilization circuit formed of a stub and a capacitance element. Power amplification transistor Trg3 receives, at a collector, a collector control voltage Vgc3 via a stabilization circuit formed of a capacitance element and a stub.

GSM power amplifier 904 further includes a low pass filter 960 receiving bias voltage Vgcc, a bias voltage control circuit (a resistance element) 961 for applying bias control voltage VGSM from bias switch 904 shown in FIG. 14 to the base of power amplification transistor Trg1, a bias voltage control circuit 964 adjusting a base bias voltage of power amplification transistor Trg2 in accordance with bias voltage Vgcc and bias control voltage VGSM, a bias control circuit 966 adjusting a base bias voltage of power amplification transistor Trg3 in accordance with bias voltage Vgcc and bias control voltage VGSM, and a mode switch circuit 962 responsive to a mode select signal Vmodg output from bias switch 904 shown in FIG. 14 to drive bias control voltage VGSM to a ground voltage level for setting power amplification transistors Trg1, Trg2 and Trg3 to a non-conductive state.

Mode switch circuit 962 includes a switching transistor selectively turning on in response to mode select signal Vmodg. Depending on whether the switching transistor is in an ON (conductive) state or an OFF (non-conductive) state, the GSM power amplifier is selectively set to an inactive state or an active state.

Mode select signal Vmodg is generated by the bias switch 904 shown in FIG. 14 in response to mode select signal Vmod. When mode select signal Vmodg is at H level, mode switch circuit 962 has its switching transistor turned on, bias control voltage VGSM attains an L level of a ground voltage level, and power amplification transistor Trg1 turns off. Furthermore, in bias control circuits 964 and 966, their respective output voltages attain the base-emitter voltage of power amplification transistors Trg2 and Trg3, and power amplification transistors Trg2 and Trg3 also turn off. Thus, in this state, GSM power amplifier 904 stops the power amplification operation.

When mode select signal Vmodg attains an L level, mode switch circuit 962 has its switching transistor turned off, power amplification transistors Trg1, Trg2, Trg3 have the base voltages biased by bias voltage control circuits 961, 964 and 966 in accordance with bias voltage VGSM and bias control voltage Vgcc, and amplify the signals received from their respective, preceding matching circuits.

The power amplifiers 900 and 904 shown in FIGS. 15 and 16 are only different in processing frequency and they have three amplification stages. Final-stage power amplification transistors Trd3 and Trg3 each have a sufficiently large current driving capability because each has its collector coupled to an output pad and drives an output load via output matching circuit 957 with a large driving power.

Bias switch 902 receives bias control voltages Vpcd and Vpcg respectively for the DCS and GSM modes, and also receives mode select signals Vmodd and Vmodg, and enables one of DCS and GSM power amplifiers 900 and 904 in response to the mode select signals.

Bias switch 902 selectively activates one of power amplifiers 900 and 904, so that communication is enabled in 1800 MHz-band DCS and 900 MHz-band GSM.

FIG. 17 schematically shows a configuration of a main portion of a mobile phone including the dual-band power amplification circuit. In FIG. 17, the mobile phone includes a battery power supply 980 supplying collector bias voltages Vdc1 to Vdc3 and bias voltage Vdcc for DCS power amplifier 900 and collector bias voltages Vgc1 to Vgc3 and bias voltage Vgcc for GSM power amplification circuit 902, a high frequency coupler 982 functioning as a band isolator transmitting a signal outputted from DCS power amplifier 900, a high frequency coupler 984 functioning as a band isolator transmitting a signal outputted from GSM power amplification circuit 902, a select circuit 986 responsive to a mode select signal (not shown) for selecting one of the signals output from high frequency couplers 982 and 984 to transmit the selected signal to an antenna 988, an output control circuit 990 monitoring a signal output from high frequency coupler 982, and generating bias control voltage Vpcd in accordance with the result of monitoring, and an output control circuit 992 monitoring a signal output from high frequency coupler 984 and generating bias control voltage Vpcg in accordance with the result of monitoring.

Output control circuits 990 and 992 apply bias control voltages Vpcd and Vpcg to bias switch 904 and in accordance with bias control voltages Vpcd and Vpcg, and bias switch 904 adjusts the levels of base bias voltages VDCS and VGSM to power amplification circuits 900 and 902.

For GSM and DCS applications, a power amplifier is required to deal with a high output power of no less than 1 W. Accordingly, in order to reduce power loss in a voltage regulator, bias voltages Vdc1 to Vdc3, Vdcc, Vgc1 to Vgc3 and Vgcc to power amplification circuits 900 and 902 are supplied directly from battery power supply 980.

DCS power amplification circuit 900 transmits the output signal, via high frequency coupler 982 and select circuit 985, to antenna 988. GSM power amplification circuit 902 transmits the output signal, via high frequency coupler 984 and select circuit, 986 to antenna 988. Between the output terminals of power amplification circuits 900 and 902 and an end of the antenna, normally there is not provided an isolator generally provided used in a domestic mobile phone (e.g., a personal digital cellular (PDC)) or others. This isolator is provided to prevent the variation of the output load impedance of power amplification circuits 900 and 902 when antenna terminal 988 varies in output impedance. In GSM and DCS applications, such an isolator is not used to achieve down-sizing and reduce output loss, and high frequency couplers 982 and 984 are simply used.

Thus, there is a severe condition of use for power amplifiers 900 and 902, such as a high power supply voltage condition upon completion of charging of battery power supply 980 and a variation in load of antenna terminal 988 directly exerted on power amplifiers 900 and 902. When an output load varies under the high power supply voltage condition, collector loss is increased to generate heat due to the current loss in the collector loss, and transistor cells constructing a power amplification transistor operate ununiformly. The power amplification transistor is caused because the power amplification transistor is constructed by a plurality of unit transistor cells and the operating temperature conditions for the unit cell transistors vary due to the distribution of the collector currents and the ununiform operation of the transistor cells is caused due to the variation in operation temperature condition.

In particular, the ununiform operation of unit cell transistors in final-stage power amplification transistor Trg3 or Trd3 would cause a current concentration that the operating currents of a part of unit cell transistors occupy a major portion of the whole operating current of the final-stage transistor. Consequently, variation in power output within a pulse in a burst operation is introduced and in the worst case, the final-stage power amplification transistor would be eventually destroyed.

Such current concentration due to generated heat is a disadvantage peculiar to a power amplifier having a plurality of unit transistor cells arranged closely adjacent to each other within a chip.

FIG. 18 schematically shows a layout of a chip of the power amplifiers shown in FIGS. 15 and 16. In FIG. 18, DCS and GSM power amplifiers 900 and 902 are formed in a semiconductor chip 999 at bi-divided regions, respectively. On this semiconductor chip, there are arranged the circuits indicated in FIGS. 15 and 16 by broken line blocks.

DCS power amplifier 900 has its first-stage power amplification transistor Trd1 arranged in a transistor formation region PWD1, and a second-stage power amplification transistor Trd2 arranged in a transistor formation region PWD2. Between transistor formation regions PWD2 and PWD1, a matching circuit arrangement region IMD12 is arranged, in which an inter-stage matching circuit 912 is formed to achieve an inter-stage matching between power amplifiers Trd1 and Trd2.

Furthermore, in DCS power amplifier 900 at a region IMD23, an inter-stage matching circuit 915 is arranged to achieve a matching between the second-stage power amplification transistors Trd2 and the third (final) stage power amplification transistor Trd3. Opposite to the transistor formation regions PWD1 and PWD2 and the matching circuit arrangement region IMD12 with respect to the matching circuit arrangement region IMN 23, a transistor formation region PWD3 for arranging the final-stage power amplification transistor Trd3 is arranged. The transistor formation region PWD1, the matching circuit arrangement region IMN12 and the transistor formation region PWD2 are aligned in a line, and adjacent to these regions the matching circuit arrangement region IMN23 is arranged adjacent to the regions PWD23, IMN12 and PWD2.

The first-stage power amplification transistor Trd1 is formed, for example, of two unit transistor cells. The second-stage power amplification transistor Trd2 is formed, for example, of ten unit transistor cells. The final-stage power amplification transistor Trd3 is formed, for example, of 6×10 unit transistor cells.

An empty region EPY is arranged adjacent to transistor formation region PWD3 for arranging the final-stage power amplification Trd3. Facing the empty region EPY and the transistor formation region PWD3, a pad region OBD is arranged in which bonding pads for output of DCS are arranged. Since the final-stage power amplification transistor Trd3 is made large in driving current and has an output signal line also made wide, a plurality of pads are arranged in pad region OBD to increase the output line width sufficiently.

For GSM power amplifier 902, the first-stage power amplification transistor Trg1 is arranged in a transistor formation region PWG1 and the second-stage power amplification transistor Trg2 is arranged in a transistor formation region PWG2. Between transistor formation regions PWG1 and PWG2, there is arranged a region IMG12 for arranging an inter-stage matching circuit 953. Regions PWG1, IMG12 and PWG2 are aligned on a line.

Adjacent to regions PWG1, PWG2 and IMG12, there is arranged a region IMG23 in which an inter-stage matching circuit 955 is laid out.

The final-stage power amplification transistor Trg3 is formed in a transistor formation region PWG3 adjacent to region IMG23 and arranged in alignment with the transistor formation region PWD3 and empty region EPY.

Power amplification transistor Trg1 is formed, for example, of four unit transistor cells, the second-stage power amplification transistor Trg2 is formed, for example, of 16 unit transistor cells, and the final-stage power amplification transistor Trg3 is formed, for example, of 10×10 unit transistor cells.

Adjacent to transistor formation region PWG3, an output bonding pad region OBG is provided in which output bonding pads for GSM are arranged.

Power amplifiers 900 and 902 are integrated on a semiconductor chip 999. As shown in FIG. 18, the regions for corresponding components of DCS power amplifiers 900 and 902 are arranged in parallel, power amplifiers 900 and 902, substantially identical in circuit configuration, are arranged efficiently and have the layout facilitated.

As shown in FIG. 18, in power amplifiers 900 and 902, their final-stage power amplification transistors are greater in current driving capability and occupy a larger chip area than the first- and second-stage power amplification transistors occupy.

FIG. 19 schematically shows a configuration of the final-stage power amplification transistors Trd3 and Trg3 of power amplifiers 900 and 902. The final-stage output amplification transistors Trd3 and Trg3 are merely different in the number of transistor cells included therein, and FIG. 19 shows a configuration of a single power amplification transistor.

In FIG. 19, the final-stage output amplification transistor includes unit transistors Tr11 to Tr1n through Trm1 to Trmn arranged in m rows and n columns, each of which are constructed by a hetero bipolar transistor (HBT).

Sub collector lines SL1 to SCLm are arranged corresponding to the rows of unit transistors, respectively, and sub base lines SBL1 to SBLm are arranged corresponding to the rows of unit transistor cells, respectively. Sub base lines SBL1-SBLm are coupled to a main base line MBL receiving a base bias voltage from a base bias voltage control circuit via a node A and a radio frequency (RF) input from a preceding inter-stage matching circuit via a node B. Sub collector lines SCL1-SCLm are commonly coupled to a main collector line MCL coupled to an output node C.

Unit transistors Tr11 to Tr1n through Trm1 to Trmn have their respective bases coupled to the corresponding sub base lines SBL1-SBLm through base ballast resistors Rb11 to Rb1n through Rbm1 to Rbmn. Furthermore, unit transistors Tr11 to Tr1n through Trm1 to Trmn have their respective emitters coupled to a ground node through emitter ballast resistors RE11 to Re1n through Rem1 to Remn, respectively.

When temperature rises and a collector current is increased, ballast resistors Rb11–Rb1n through Rbm1-Rbmn and Re11–Re1n through Rem1–Remn apply negative feedback to reduce base-emitter voltages of the corresponding unit transistors and prevent the collector currents from increasing. A bipolar transistor configured of the plurality of unit transistors is referred to as a multi-finger bipolar transistor.

FIG. 20 schematically shows a layout of the final-stage power amplification transistor shown in FIG. 19. In FIG. 20, unit cell regions 11–17, 21–27, 31–37, 41–47, 51–57, and 61–67, in each of which a unit transistor Tr is formed, are arranged in alignment in six rows. These unit cell regions are divided into three blocks BA, BB and BC each including unit cell regions aligned in two rows.

In each of unit cell regions 11–17, 21–27, 31–37, 41–47, 51–57, and 61–67, HBT is formed and an emitter region, a collector region and a base region are provided.

Sub emitter interconnection lines 5c1–5c6 are arranged each common to the unit cell regions aligned in a row (or unit transistor Tr), and are coupled to the emitter regions of unit cells on a corresponding row. Sub emitter interconnection lines 5c1–5c6 are connected to emitter interconnection lines 5a and 5b extending in the column direction on opposite sides of the unit transistor formation regions. Emitter interconnection lines 5a and 5b are coupled to a ground node supplying a ground voltage. In regions at which sub emitter interconnection lines 5c1–5c6 and unit transistors Tr formation region overlap with each other, emitter ballast resistors are formed, for example, of an epitaxial layer.

Base interconnection lines 2b1–2b3 are arranged in blocks BA–BC, respectively, common to the unit cell regions in the respective blocks. Sub base interconnection lines 2b1–2b3 are each arranged extending in a corresponding block through a region located between two rows of unit cell regions, and are each coupled to the base regions of the unit cells in the corresponding block via base ballast resistors 7.

Sub base interconnection lines 2b1–2b3 are coupled to a base interconnection line 2a coupled to an RF signal input portion 1 receiving a RF input from a preceding amplification stage through an inter-stage matching circuit. Base interconnection line 2a also receives a base bias control voltage from a corresponding bias voltage control circuit. Unit transistors Tr formed in unit cell regions 11–17 to 61–67 are each a heterojunction bipolar transistor HBT and sub base interconnection lines 2b1, 2b2 and 2b3 receive base currents Ib1, Ib2 and Ib3, respectively.

Furthermore, corresponding to each row of unit cell regions, sub collector interconnection lines 4b1–4b6 are provided each common to the unit cells in a corresponding row. Sub collector interconnection lines 4b1–4b6 are each coupled to the unit cells in a corresponding row at the collector regions in common. Sub collector interconnection lines 4b1–4b6 are commonly connected to a collector interconnection line 4a connected to an output portion 3 outputting a high frequency (RF) signal.

Sub collector interconnection lines 4b1–4b6 receive a current shunted from a collector current supplied to collector interconnection line 4a and thus receive collector currents Ic1–Ic6, respectively.

In an HBT, a collector current increases as temperature rises. If this temperature rise cannot be stopped, the collector current further increases and the increased current in tern further rises the temperature, and a current thus increases infinitely, or thermal run away is caused. To prevent this thermal run away, base ballast resistor 7 and an emitter ballast resistor (not shown) are arranged to prevent the collector current from increasing. In particular, connection of an emitter ballast resistor and base ballast resistor 7 to each unit transistor Tr prevents the ununiform or uneven distribution of collector current Ic caused by ununiformity in thermal distribution or the like of a multi-finger bipolar transistor formed of unit transistors Tr.

When such a transistor cell is arranged, sub collector interconnection lines 4b1–4b6 are adapted to be equal in line impedance for making collector currents Ic1–Ic6 flowing therethrough substantially uniform. In this case, as shown in FIG. 20 at a round region 8, in operation, a driving current causes a temperature distribution to cause such a temperature distribution in the transistor array that the center portion is high in temperature and the peripheral portion is low in temperature.

If such a temperature distribution is caused, there is a high possibility that a collector current concentrates in unit cell regions 34 and 44 at a center portion of the transistor array. If such a collector current concentration occurs, a major portion of the total of collector currents Ic1–Ic6 flows through unit transistors formed at unit cell regions 34 and 44 and the operating currents flowing through the unit cells in unit cell regions 34 and 44 thus occupies a major portion of the operating current of the final-stage power amplification transistor.

Thus, if a large collector current flows through unit cell regions 34 and 44, the following disadvantage would result; thermal runaway is caused in the round region 8, the transistors in unit cell regions 34 and 44 are destroyed a large current flows from collector interconnection line 4a to emitter interconnection lines 5a and 5b, and the entirety of the power amplification transistor is destroyed.

Such current concentration in a multi-finger bipolar transistor can effectively be avoided by increasing the spacing between unit transistors to suppress thermal interference between the unit transistors to arrange the unit transistors in a thermally isolated state from each other for reducing the overall thermal resistance. This, however, increases the layout area of the final-stage power amplification transistor and the increased area of the final-stage power amplification transistor, which occupies a large area of the chip, increases the chip size.

In particular, in a case of an HBT amplifier formed of a compound semiconductor such as GaAs, it is more expensive than a Si-MOSFET and reduction of chip area is important in view of price.

Japanese Patent Laying-Open No. 2001-102460 discloses such an arrangement that in a dual-band power amplification circuit, GSM and DCS power amplifiers do not operate simultaneously and the final-stage power amplification transistors of these GSM and DCS amplification circuits have their unit transistors arranged alternately. In this configuration, the transistor adjacent to a unit transistor does not operate. It is intended to alleviate the pitch condition on the unit transistors equivalently to reduce the thermal resistance to suppress heat generation.

However, GSM utilizes a frequency band of 900 MHz and DCS uses a frequency band of 1800 MHz. Therefore, in the configuration of arranging the unit transistors alternately, when GSM power amplifier is used, a harmonic thereof is transmitted to an output node of the DCS power amplifier through capacitive coupling of the final-stage power amplification transistors. Thus, as shown in FIG. 17, via coupler 982 and select circuit 986, a harmonic noise component provided from the DCS power amplifier is superimposed on this GSM transmission signal, and transmission quality would be deteriorated.

Furthermore, if the unit transistors of DCS and GSM output transistors are arranged in separate regions with a sufficient pitch condition in each region, and the separate regions for GSM and for DCS, similarly, due to a capacitive coupling between interconnection lines, a noise is superimposed and transmission quality is impaired. Furthermore, in this case, in view of reduction of chip area, the pitch of the unit transistors cannot sufficiently be increased, and the issue of the current concentration cannot sufficiently be overcome.

SUMMARY OF THE INVENTION

An object of the present invention is to provide a multi-band power amplification circuit capable of reducing a chip size without impairing transmission quality.

Another object of the present invention is to provide a multi-band power amplification circuit capable of reducing a chip size while avoiding current concentration.

An amplifier according to a first aspect of the present invention includes: a first output transistor, including a plurality of first unit transistor cells, for outputting a signal of a first frequency band; a second output transistor including a plurality of second unit transistor cells and outputting a signal of a second frequency band different from the first frequency band; and an inductance element arranged between an output node of the first output transistor and an output node of the second output transistor.

An amplifier according to a second aspect of the present invention includes: a first output transistor, having a plurality of first unit transistor cells, for outputting a signal of a first frequency band; and a second output transistor, having a plurality of second unit transistor cells arranged to for outputting a signal of a second frequency band. The second and first unit transistor cells are arranged surrounding alternately with each other.

An inductance element is arranged between the output node of the first output transistor and the output node of the second output transistor. Thus, even if the first and second output transistors are formed of unit transistor cells arranged close to each other, the inductance element cooperates with a parasitic capacitance to form a resonant circuit for a harmonic component. Thus, the output nodes are coupled through a high impedance and a harmonic component of the second output transistor is prevented from being transmitted via the first output transistor through capacitive coupling. Thus, without impairing transmission quality, the first and second unit transistors can be arranged closely adjacent to each other and the first and second output transistors can thus be arranged in a reduced area to reduce a chip occupation area.

In particular, even when the first and second unit transistor cells are mixedly formed in a transistor cell formation region and the effective pitches of the unit transistor cells are reduced to reduce a thermal resistance, a noise component generated through capacitive coupling of a harmonic component can also be prevented. A chip size can be efficiently reduced without impairing transmission quality and destruction of the element due to current concentration can be prevented.

Furthermore, by arranging the unit transistor cells to surround each other, the unit cells in operation are free of thermal boundary and in the transistor region in operation, heat is dissipated to suppress heat concentration and hence prevent current concentration from occurring.

Furthermore, when the first and second output transistors have their unit transistor cells arranged alternately, unit transistor cells that simultaneously operate can be arranged in a dispersed manner in the transistor formation region. Accordingly, thermal resistance can be reduced, heat generation can be suppressed, and the unit transistor cells can also have a reduced pitch, and accordingly, a reduced chip size can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 schematically shows a layout of the unit transistors of the final-stage power amplification transistor in accordance with a fifth embodiment of the present invention;

FIGS. 11A and 11B schematically illustrate thermal distribution of a row of unit transistors;

PREFERRED EMBODIMENTS OF THE PRESENT INVENTION

First Embodiment

Figure 1:
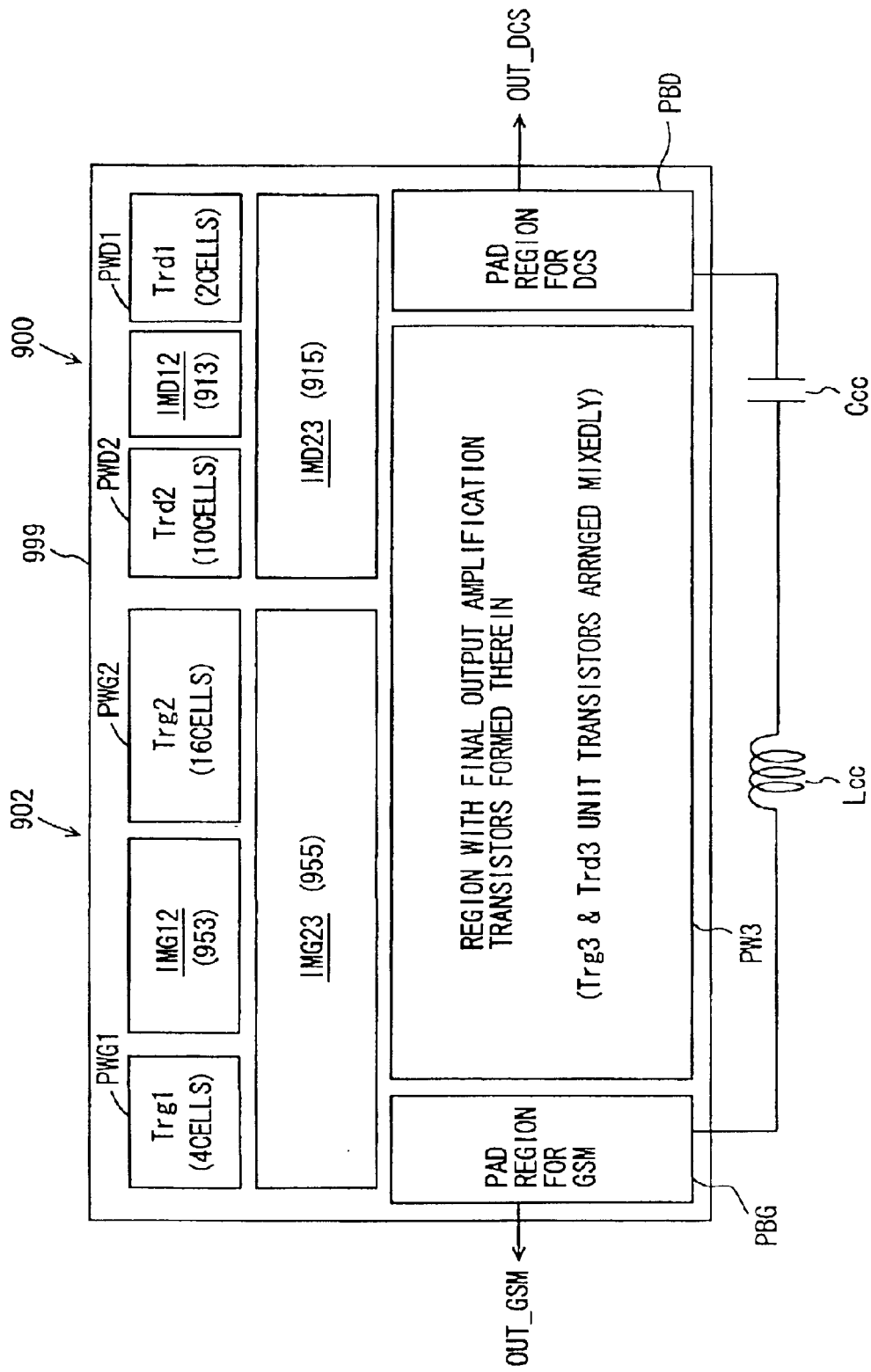
FIG. 1 schematically shows a layout of a chip of a dual-band power amplification circuit in accordance with a first embodiment of the present invention.
Figure 18:
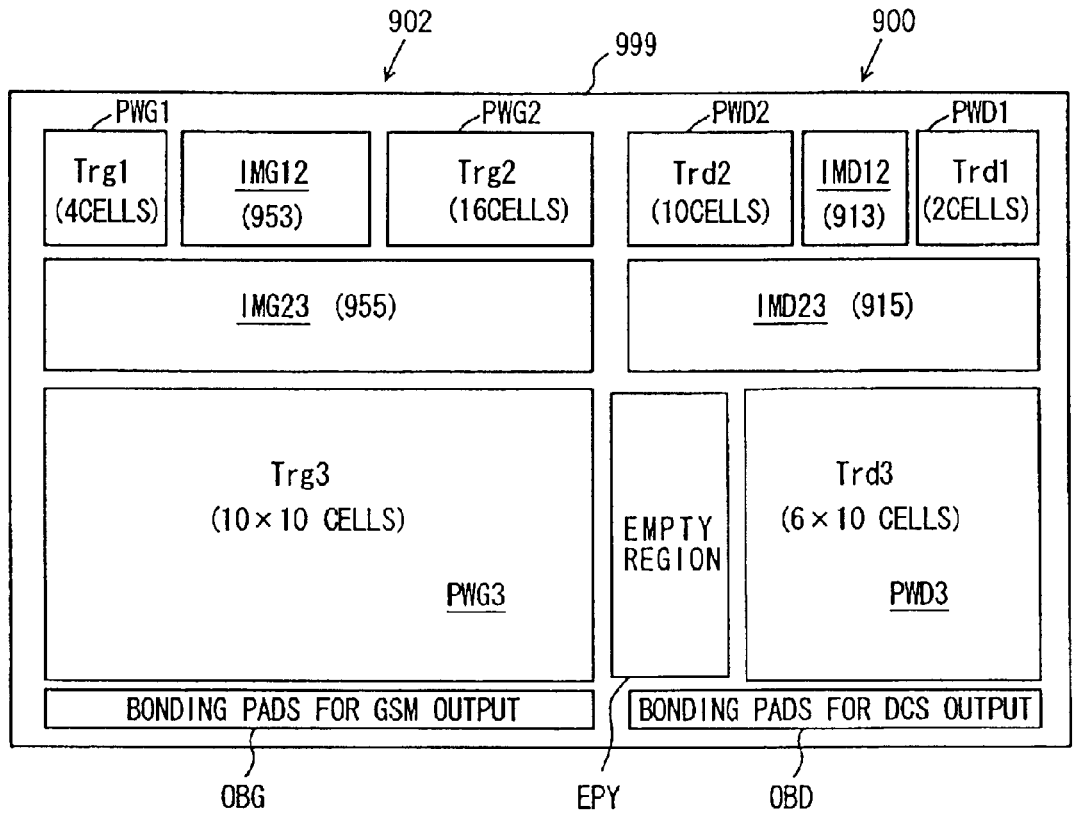
FIG. 18 schematically shows a layout of a chip of a final-stage power amplification transistor in a conventional dual-band power amplifier.
Figure 19:
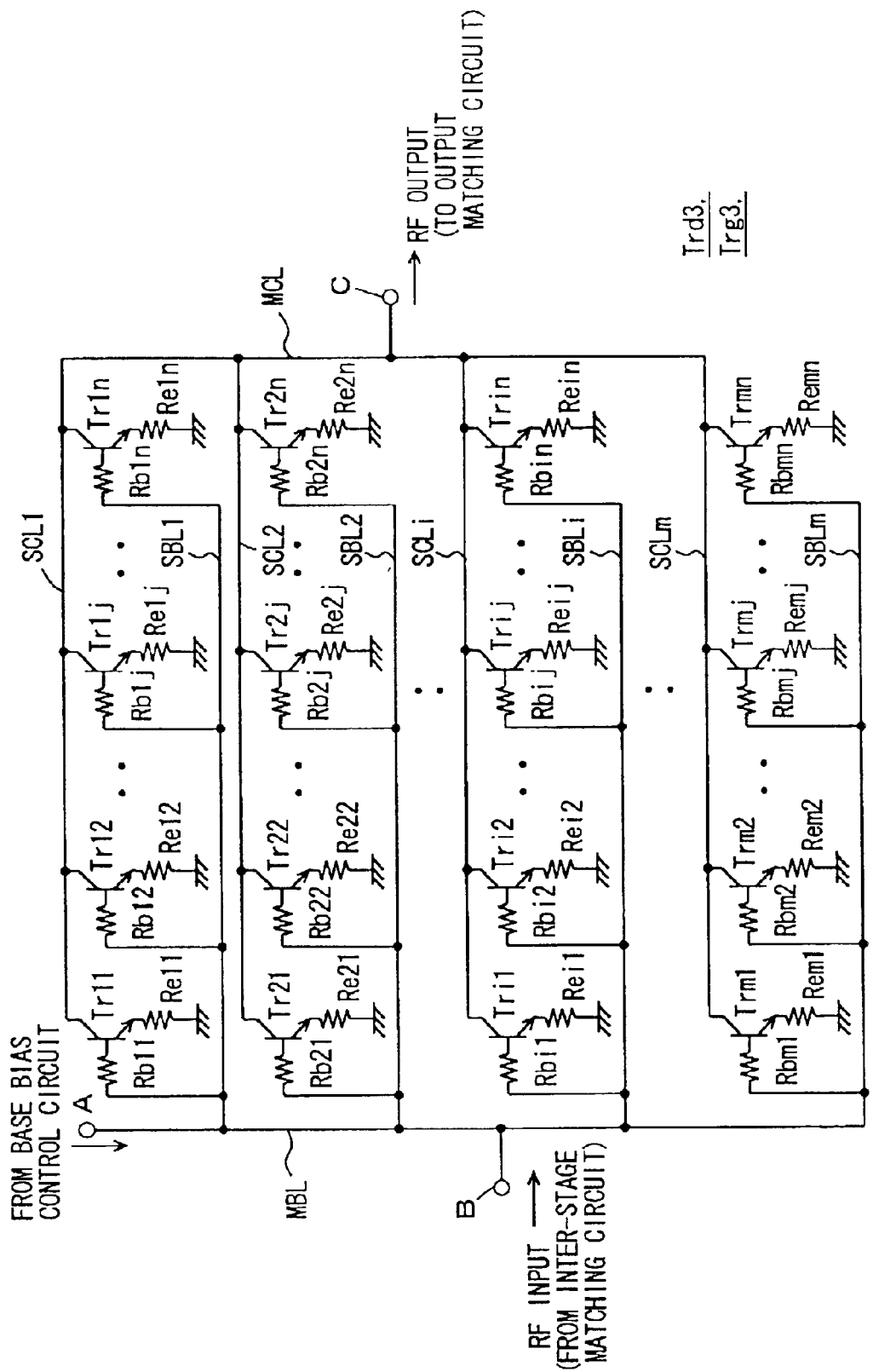
FIG. 19 schematically shows a configuration of a final-stage power amplification transistor of a conventional power amplifier.
Figure 20:
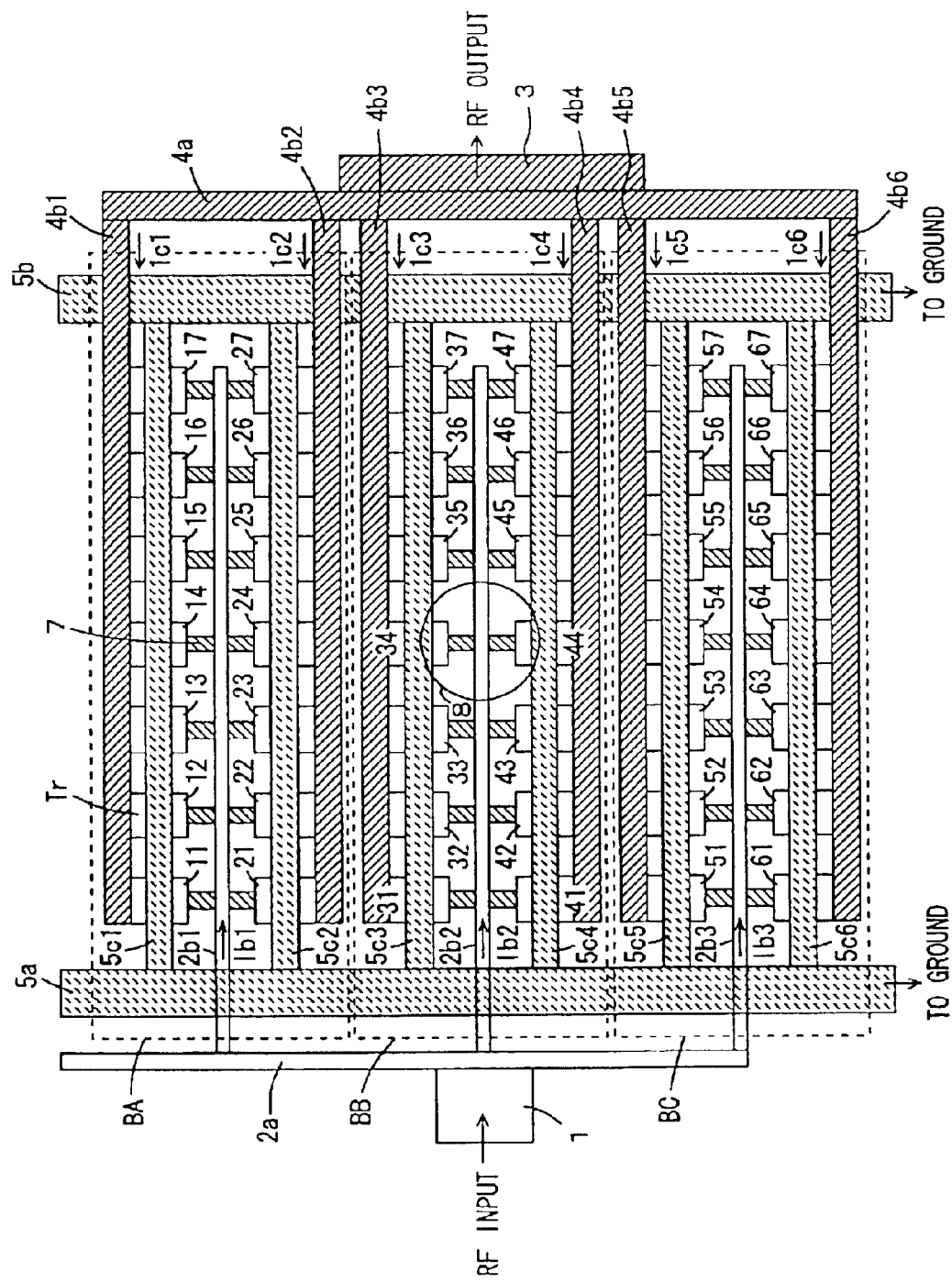
FIG. 20 shows a layout of the unit transistors shown in FIG. 19.

FIG. 1 schematically shows a layout of a chip of a DCS/GSM dual-band power amplification circuit in accordance with a first embodiment of the present invention. The dual-band power amplification circuit of FIG. 1 is different in layout from that shown in FIG. 18 in the following points. Unit transistors (Tr) for constructing final-stage output power amplification transistors Trd3 and Trg3 of the respective DCS and GSM power amplifiers are arranged in a mixed manner in a region PW3 for forming the final output amplification transistors.

A DCS pad region PBD and a GSM pad region PBG are arranged opposite each other with respect to the region PW3. The DCS final-stage power amplification transistor has its collector connected to an output line connected to pads in DCS pad region PBD to output an output signal OUT_DCS.

The GSM final-stage power amplification transistor has its collector connected to an output line connected to pads included in DSM pad region PBG to output an output signal OUT_GSM.

By arranging DCS and GSM pad regions PBD and PBG opposite to each other, DCM and GSM signal output nodes can be spaced as far as possible, to prevent the capacitive coupling in between for achieving inter-band isolation.

Furthermore, GSM and DCS pad regions PBG and PBD have their pads (or output lines) interconnected through a series body of an inductance element Lcc and a capacitance element Ccc. The other layout on the chip of the circuit shown in FIG. 1 is identical to that of the chip of the circuit shown in FIG. 18, and like components are denoted by like reference characters and the detailed description thereof is not repeated.

By arranging, in the final-output amplification transistor formation region PW3, the unit transistors for the DCS amplification transistor and for the GSM power amplification transistor in a mixed manner, the distance between simultaneously operating unit transistors can be increased to reduce the thermal resistance, and current concentration due to heat concentration can be prevented. Furthermore, with unit transistors arranged in a mixed manner, the distance between adjacent unit transistors are not required to be increased for reducing thermal resistance, and can be made shorter than in a conventional device to reduce the total area of the final-stage power amplification transistors, as compared to the conventional.

Pads in DCS pad region PBD are connected to a collector of power amplification transistor Trd3 configured of unit transistors arranged in the final-output amplification transistor formation region PW3. Pads in GSM pad region PBG are connected to a collector of power amplification transistor Trg3 arranged in the final-output amplification transistor formation region PW3.

As described above, the final-output amplification transistor formation region PW3 has the unit transistors configuring the power amplification transistors Trd3 and Trg3 arranged in a mixed manner. Accordingly, these unit transistors are interconnected by DCS and DSM sub collector lines arranged close to each other, as will be more specifically described later of layout, and there exists a coupling capacitance between these interconnection lines.

Figure 2:
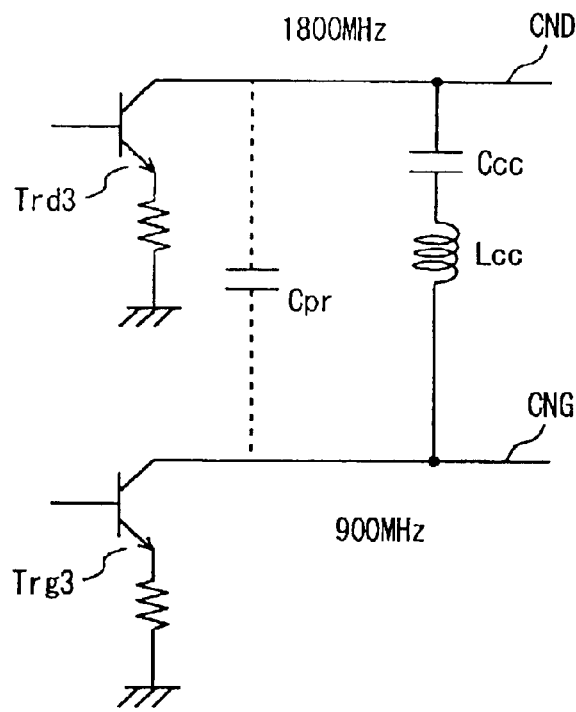
FIG. 2 is a diagram for illustrating a function of an inductance element shown in FIG. 1.

FIG. 2 shows an electrically equivalent circuit of a configuration of an output portion of the final-stage power amplification transistors Trd3 and Trg3. In FIG. 2, a parasitic capacitance Cpr is connected between the collector nodes CND and CNG of the power amplification transistors Trd3 and Trg3. Furthermore, a capacitance element Ccc and an inductance element Lcc are connected in series between collector nodes CND and CNG. Capacitance element Ccc is a DC cut off capacitance, or AC short circuit capacitance for preventing DC (direct current) collector bias voltage of the power amplification transistors Trd3 and Trg3 from being transmitted through the inductance element. It is thus assumed that an impedance component in a RF range of capacitance element Ccc can be ignored, as compared to the impedance of parasitic capacitance Cpr and the impedance of inductance element Lcc. In this case, an impedance Z between collector nodes CNG and CND is represented by the following equation:

$$Z = 1/(j \cdot \omega \cdot Cpr + 1/j \cdot \omega \cdot Lcc)$$

Impedance Z assumes a maximum absolute value when a resonance condition holds, and the resonance condition is represented in the following equation:

$$\omega = 1/\sqrt{(Lcc \cdot Cpr)}$$

Thus, when 1800 MHz is selected for the resonant frequency ω, even if the GSM power amplifier operates, and there exists a secondary harmonic component of its output frequency band of 900 MHz, i.e., a component of 1800 MHz, this parallel resonant circuit electrically separates the collector nodes CND and CNG. Thus, the secondary harmonic component can be prevented from being transmitted from collector node CNG of power amplification transistor Trg3 to collector node CND of power amplification transistor Trd3.

Figure 17:
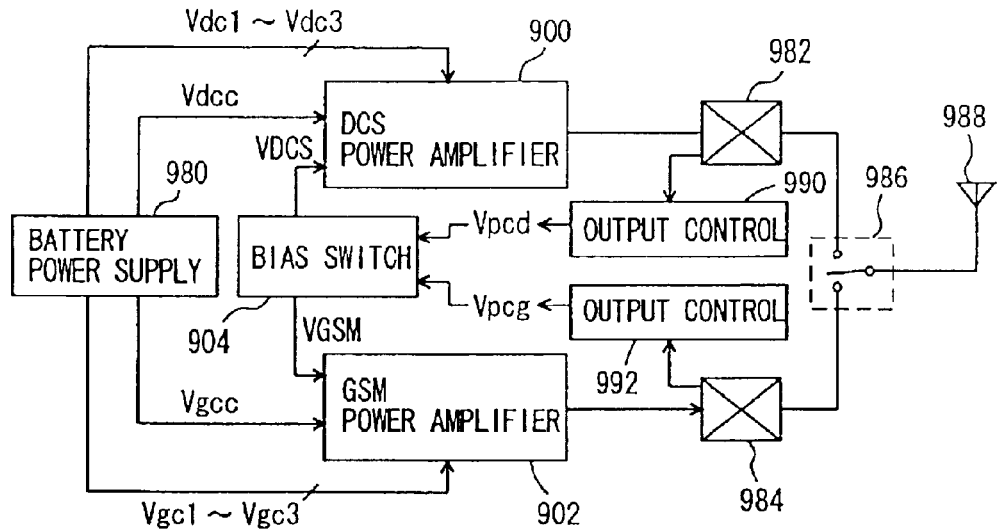
FIG. 17 schematically shows a configuration of a main portion of mobile equipment using a conventional dual-band power amplification circuit.

Thus, by setting resonant frequency ω to a frequency component of a DCS frequency band, in the GSM operation, the impedance between collector nodes CND and CNG can be made infinite by a parallel resonant circuit, to prevent transmission of the secondary harmonic component of a harmonic component to the output node of the DCS power amplifier. Consequently, even if in a normal dual-band amplification circuit, an RF (high frequency) coupler and a select circuit are provided at a subsequent stage through which a signal output from the GSM power amplifier is transmitted to an antenna terminal, as shown in FIG. 17, the inventive arrangement can prevent transmission of a harmonic noise component from the output node of the DCS power amplifier via RF coupler 982 and selector 986 to the antenna.

In the final output amplification transistor formation region PW3, there are arranged unit transistors of final-stage power amplification transistors Trd3 and Trg3 in a mixed manner, to reduce the actual pitch condition between the unit cell regions to reduce the occupation area of the final output amplification transistor formation region PW3, as compared to the arrangement in which DCS final-stage amplification transistor and the GSM final-stage power amplification transistor are arranged individually. Furthermore, unit transistors that simultaneously operate are also arranged distant from each other, and thermal resistance is equivalently reduced to suppress heat generation to prevent current concentration attributed to generated heat. Even if parasitic capacitance Cpr exists due to the mixed arrangement of unit transistors, inductance element Lcc is arranged between output nodes to cooperate with the parasitic capacitance to provide an infinite impedance to a secondary harmonic component of GSM, a noise component can be prevented from superimposing on a GSM transmission signal reliably to improve transmission quality.

It would be sufficient for inductance element Lcc to have an appropriate inductance value determined considering the actual capacitance value of parasitic capacitance Cpr. Furthermore, capacitance element CWC is only required to cut off a DC component of a bias voltage of collector node CND, and its capacitance can have any small value small, conditioned that in the frequency band of 1800 MHz, an absolute value of an impedance component, $1/\omega \cdot Ccc$, is a sufficiently small value negligible as compared to an absolute value $\omega \cdot Lcc$ of an impedance component of inductance element Lcc.

As described so far, according to the first embodiment, a dual-band power amplification circuit includes final-stage power amplification transistors formed of unit transistors arranged in a mixed manner within a single transistor formation region and the output-stage power amplification transistors have an inductance element coupled between the respective output nodes. The inductance element forms a parallel resonant circuit with a parasitic capacitance. Thus, a reduced chip size can be achieved and also a noise attributed to a secondary harmonic component from being superimposed on a transmission signal. As a result, a reduced chip size can be achieved without impair of transmission quality and current concentration.

Second Embodiment

Figure 3:
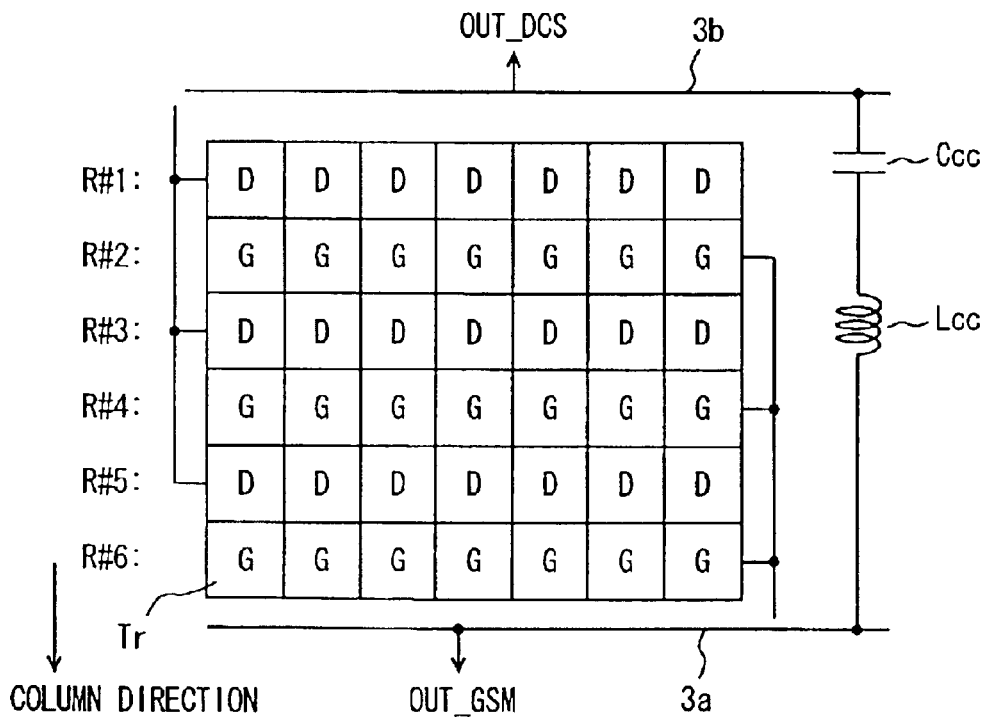
FIG. 3 schematically shows an arrangement of unit transistors of a final-stage power amplification transistor in accordance with a second embodiment of the present invention.

FIG. 3 schematically shows an arrangement of unit transistor Tr of the final-stage power amplification transistor in accordance with a second embodiment of the present invention. In FIG. 3, unit transistors Trs are arranged in a plurality of rows and a plurality of columns. FIG. 3 exemplarily shows a layout of arranging unit transistors Trs in six rows and seven columns.

In this transistor array, unit transistors Trs arranged in odd-numbered rows R#1, R#3 and R#5 are used as the final-stage power amplification transistor of the DCS power amplifier, and unit transistors Trs arranged in even-numbered rows R#2, R#4 and R#6 are used as components of the final-stage power amplification transistor of the GSM power amplifier. In FIG. 3, a letter "D" denotes unit transistor Tr used as a component of the DCS power amplification transistor and a letter "G" denotes unit transistor Tr used as a component of the final-stage power amplification transistor of the GSM power amplifier.

Unit transistors Ds have their collectors commonly coupled to a DCS output signal line 3b and unit transistors Gs have their collectors commonly coupled to a GSM output signal line 3a. Between output signal lines 3a and 3b, capacitance element Ccc for cutting off a direct current and inductance element Lcc to form a parallel resonant circuit in conjunction with the parasitic capacitance in the transistor array are connected in series.

In the unit transistor array shown in FIG. 3, in a column direction, DCS unit transistors Ds and GSM unit transistors Gs are arranged alternately. DCS and GSM power amplifiers operate alternatively. For example, when DCS unit transistor D is operating, GSM unit transistor G is not operating, and does not drive a current. Thus, DCS unit transistor D can have a pitch in the column direction equivalently increased, thermal resistance in this column direction can be reduced, heat concentration can be prevented, and current concentration can accordingly be reduced.

Even if unit transistor Tr is arranged at a minimal pitch Pmin, DCS and GSM unit transistors D and G still have a pitch of 2·Pmin in the column direction. Thus, DCS and GSM unit transistors D and G can be arranged at a minimum pitch, and the final-stage transistor, occupying a large area of the power amplifier, can be arranged in a region having a reduced area and a reduced chip size can thus be achieved, as compared with the arrangement that DCS and GSM unit transistors D and G are arranged in separate regions individually.

Furthermore, DCS and GSM unit transistors Ds and Gs have their respective collector regions interconnected by interconnection lines arranged close to each other, and inductance element Lcc forms a parallel resonant circuit to the secondary harmonic component of GSM in conjunction with a parasitic capacitance between the collector interconnection lines. When a signal of a GSM frequency band of 900 MHz is transmitted, the impedance of the parallel resonant circuit becomes infinite to the secondary harmonic component to prevent the secondary GSM harmonic component from leaking from GSM output signal line 3a to DCS output signal line 3b, because the resonant frequency of the parallel resonant circuit is set to the DCS frequency band.

Figure 4:
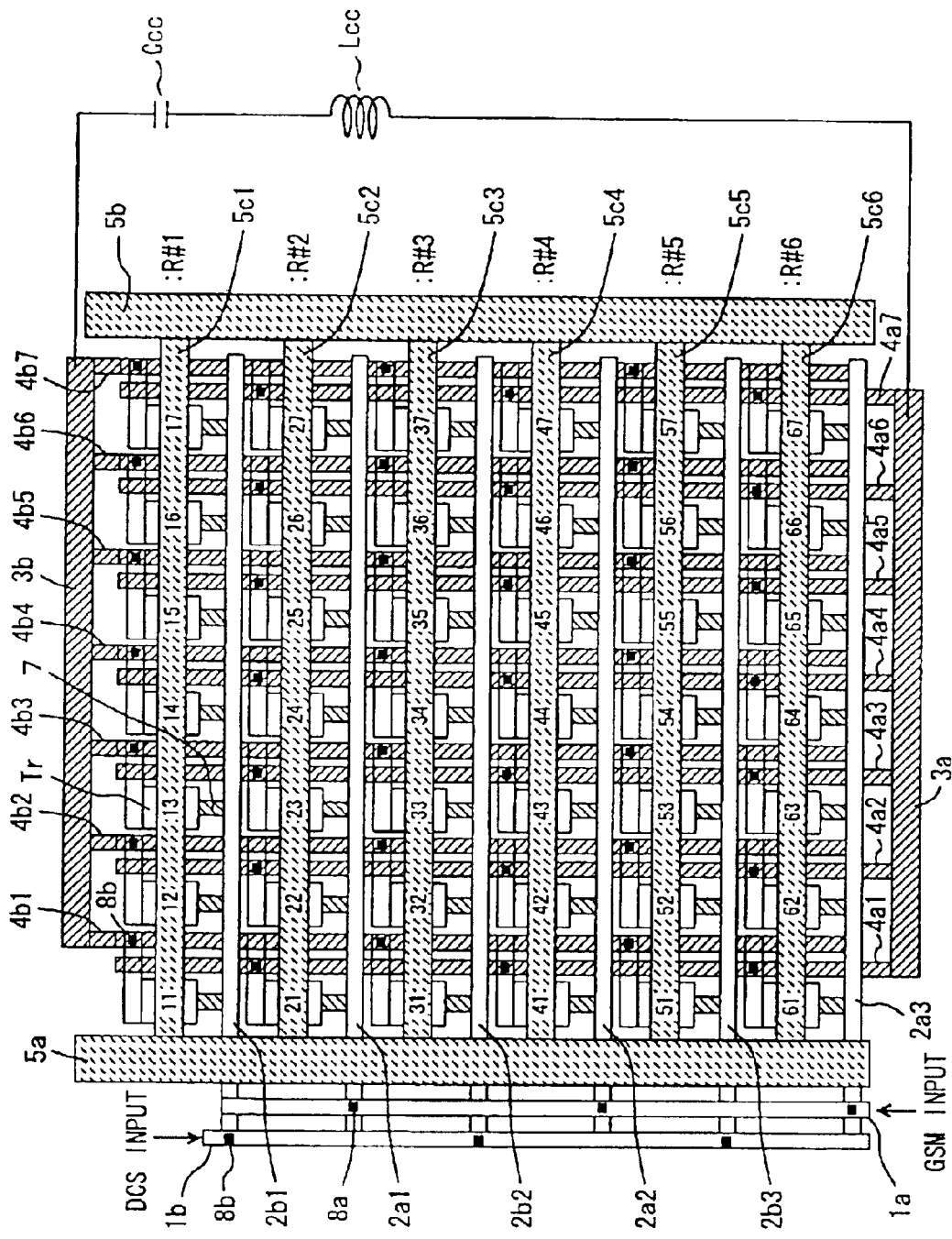
FIG. 4 more specifically shows a layout of the unit transistors of the final-stage power amplification transistor in accordance with the second embodiment of the present invention.

FIG. 4 specifically shows the layout of the final-stage power amplification transistor in accordance with the second embodiment of the present invention. In FIG. 4, unit transistors Trs are aligned in six rows and seven columns. In a first row R#1, there are arranged unit cell regions 11–17, in each of which unit transistors Trs are formed. In a second row R#2, unit cell regions 21–27 are arranged. In a third row R#3, unit cell region 31–37 are arranged. In fourth, fifth and sixth rows R#4, R#5 and R#6, unit cell regions 41–47, 51–57 and 61–67 are respectively arranged aligned in the row direction.

In each of unit cell regions 11–17 to 61–67, a hetero bipolar transistor HBT is formed to construct unit transistor Tr, and base, collector and emitter regions are formed.

In rows R#1–R#6, sub emitter interconnection lines 5c1–5c6 are arranged extending in the row direction, respectively. Sub emitter interconnection lines 5c1–5c6 are electrically connected to the unit transistor cell regions at the respective emitter regions on the corresponding rows via emitter ballast resistors. These emitter ballast resistors, as shown in FIG. 4, are each formed of an epitaxial layer and are arranged overlapping with sub emitter interconnection lines 5c1–5c6 in a two-dimensional layout. These emitter ballast resistors may be formed of a diffusion resistor.

Sub emitter interconnection lines 5c1–5c6 are connected to emitter interconnection lines 5a and 5b arranged external to the transistor cell array and extending in the column direction. Emitter interconnection lines 5a and 5b are connected to a ground node supplying a ground voltage. DCS and GSM power amplification transistors have their emitters commonly coupled to a ground node through emitter ballast resistors (not shown).

Transistor cell regions 11–17 to 61–67 have their respective base regions electrically connected to base ballast resistors 7. In unit transistor rows R#1, R#2 and R#5, sub base interconnection lines 2b1, 2b2 and 2b3 are arranged, respectively, extending in the row direction, and are electrically connected to unit cell regions at their respective base regions on the corresponding rows via the respective base ballast resistors on the respective rows. In unit cell rows R#2, R#4 and R#6, sub base interconnection lines 2a1, 2a2 and 2a3 for GSM are arranged, extending in the row direction, and are electrically connected to the unit cell regions at their respective base regions on the corresponding rows through the respective base ballast resistors 7 on the respective rows.

Sub base interconnection lines for GSM 2a1–2a3 are commonly connected through a through-hole 8a to a GSM base interconnection line 1a extending in the column direction. Sub base interconnection lines for DCS 2b1–2b3 are electrically connected through a through-hole 8b to a DCS base interconnection line 1b extending in the column direction. DCS base interconnection line 1b receives an input signal for DCS and a base bias voltage for DCS. GSM base interconnection line 1a receives a GSM signal from a preceding inter-stage matching circuit and a base bias voltage from a base bias voltage control circuit. Base interconnection lines 1a and 1b are arranged adjacent to each other and extending in the column direction.

Corresponding to the columns of unit cell regions, DCS sub collector interconnection lines 4b1–4b7 are arranged extending in the column direction, and GSM sub collector interconnection lines 4a1–4a7 are also arranged adjacent to sub collector interconnection lines 4b1–4b7, respectively, and extending in the column direction. Sub collector interconnection lines 4b1–4b7 are electrically connected to DCS unit cell regions at the collector regions on the corresponding columns through through-holes 8b. Sub collector interconnection lines 4a1–4a7 are electrically connected to GSM unit cell regions at the collector regions on the corresponding columns through through-holes 8a.

Thus, in this arrangement, DCS through-holes 8b are arranged every other row in the column direction and GSM through-holes 8a are arranged every other row in the column direction.

Sub collector interconnection lines 4b1–4b7 are connected to a DCS collector interconnection line 3b arranged extending in the column direction on one side of the transistor cell array, and sub collector interconnection lines 4a1–4a7 are connected to a collector interconnection line 3a extending in the column direction opposite to DCS collector interconnection line 3b with respect to the transistor cell array. Between collector interconnection lines 3a and 3b, a DC (direct current) cutting off (AC shorting) capacitance element Ccc and an inductance element Lcc are connected in series.

In FIG. 4, sub collector interconnection lines 4a1–4a7 and sub collector interconnection lines 4b1–4b7 are arranged extending in the column direction adjacent to each other, and are arranged alternately in the row direction.

As shown in FIG. 4, in the layout of unit transistor cell regions, sub collector interconnection lines 4b1–4b7 and 4a1–4a7 are arranged for the respective columns. Thus, although the area is increased due to the arrangement of the sub collector interconnection lines, GSM and DCS unit transistors are arranged alternately in the column direction, and the GSM unit transistors can be spaced apart from each other in the column direction, and the DCS unit transistors also can be spaced far apart from each other in the column direction. Even if the unit transistor cells are arranged at a sufficiently reduced pitch in the column direction, thermal resistance can sufficiently be reduced to prevent heat concentration. Accordingly, the total area of the final-stage power amplification transistors can be significantly reduced and the chip size can be reduced, as compared to the arrangement in which DCS transistors and GSM transistors are arranged individually in separate regions.

DCS sub collector interconnection lines 4b1–4b7 and GSM sub collector interconnection lines 4a1–4a7 are arranged adjacent to each other or in a so-called "inter-digit" form, and a parasitic capacitance between collectors becomes relatively large. In this case, a problem referred to as inter-band isolation would normally be caused. More specifically, there is a possibility that a harmonic component of 1800 MHz, twice 900 MHz generated in the GSM operation, passes through a DCS output-stage matching circuit and partially radiates from an antenna. In a DCS/GSM power amplification circuit, a coupler is merely arranged and an inter-band isolator such as in PDC is not arranged, and thus there is a possibility that the mixed arrangement of cells is accompanied with formation of an interdigit capacitor to readily introduce the inter-band isolation issue.

A capacitance between collector interconnection lines 3a and 3b generated from parasitic capacitance between DCS and GSM sub collector interconnection lines 4b1–4b7 and 4a1–4a7, and the inductance element Lcc together form a parallel resonant circuit resonating in a DCS frequency band. Thus, for a GSM secondary harmonic component generated in the GSM operation, the impedance of the parallel resonant circuit becomes infinite to prevent the secondary harmonic component of GSM from leaking from DCS collector interconnection line 3b through an output-stage matching circuit.

As described so far, according to the second embodiment, GSM and DCS unit transistors are arranged alternately in the column direction. Thus, without substantially increasing an overall size of the final-stage power amplification transistor, current concentration due to heat concentration can efficiently be prevented and a problem such as a burning can be avoid.

Furthermore, inductance element Lcc is externally arranged for forming a parallel resonant circuit in a DCS frequency band. Therefore, even if DCS sub collector interconnection lines and GSM sub collector interconnection lines are arranged adjacent to each other, the parallel resonant circuit ensures prevention of GSM harmonic component from leaking to the DCS output portion. Thus, deterioration of inter-band isolation and hence transmission quality can be reliably prevented.

It should be noted that DCS and GSM unit transistors can be arranged in any order, as far as they are arranged alternately in the column direction.

Furthermore, DCS and GSM final-stage power amplification transistors may be configured of any number of unit transistors that is determined appropriately to accommodate the power conditions required for the DCS and GSM power amplifiers of interest, respectively. These final-stage power amplification transistors may be configured of the same number of unit transistors, or may be different numbers of unit transistors (see FIG. 18).

Third Embodiment

Figure 5:
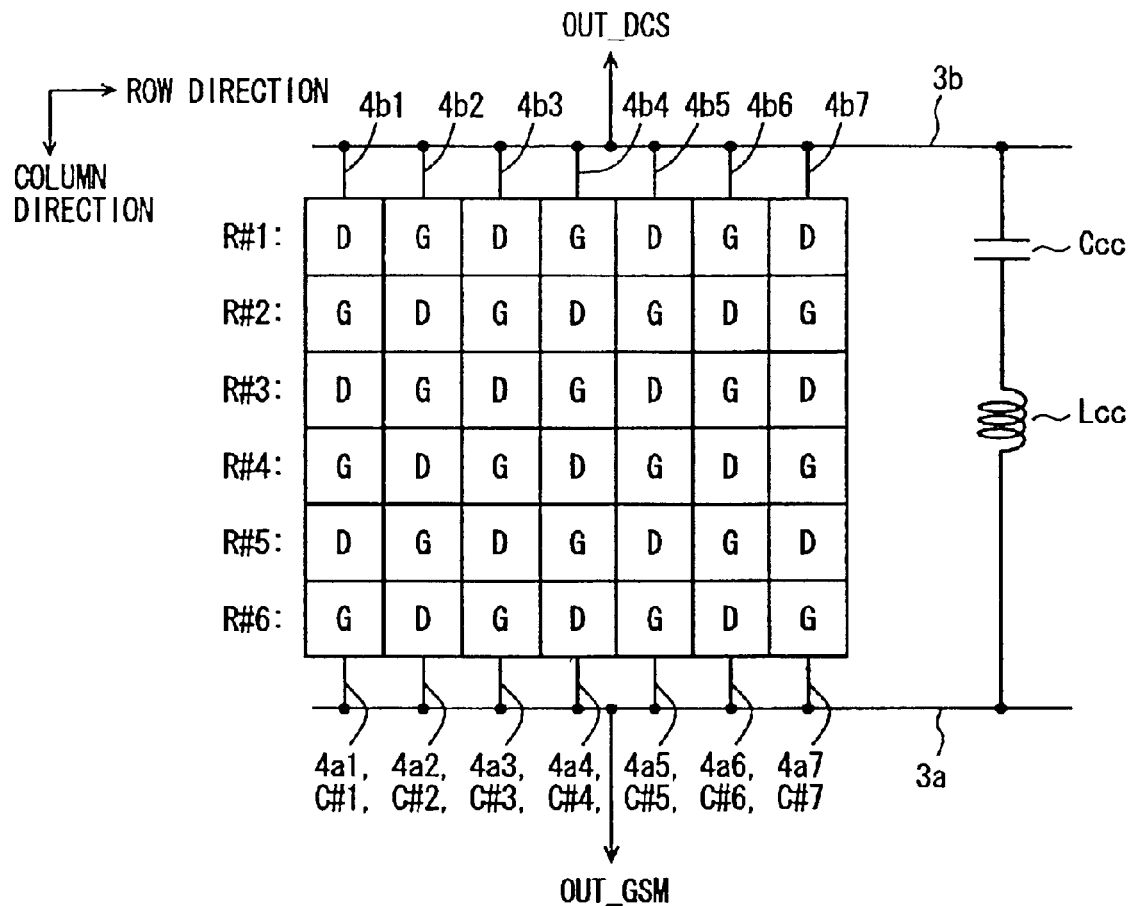
FIG. 5 schematically shows a layout of the unit transistors of the final-stage power amplification transistor in accordance with a third embodiment of the present invention.

FIG. 5 schematically shows an arrangement of unit transistors in accordance with a third embodiment of the present invention. In FIG. 5, unit transistors are arranged in rows and columns. In each of unit transistor rows R#1–R#6, a unit transistor D configuring a DCS power amplification transistor and a unit transistor G configuring a GSM power amplification transistor are arranged alternately. Furthermore, in each of unit transistor columns C#1–C#7, DCS and GSM unit transistors D and G are arranged alternately. That is, in the arrangement of FIG. 5 of unit transistor cells, DCS and GSM unit transistors D and G are arranged alternately, in both of the row direction and the column direction.

For interconnecting the collectors of GSM unit transistors Gs, sub collector interconnection lines 4a1–4a7 are arranged, in unit transistor columns C#1–C#7, extending in the column direction. For interconnecting the collectors of DCS unit transistors Ds, sub collector interconnection lines 4b1–4b7 are arranged, in unit transistor columns C#1–C#7, extending in the column direction. Sub collector interconnection lines 4a1–4a7 are commonly coupled to a GSM output line 3a, and sub collector interconnection lines 4b1–4b are commonly coupled to DCS output line 3b. Between output lines 3a and 3b, a capacitance element Ccc for cutting off a direct current or for AC short-circuit and an inductance element Lcc are connected in series.

Figure 6:
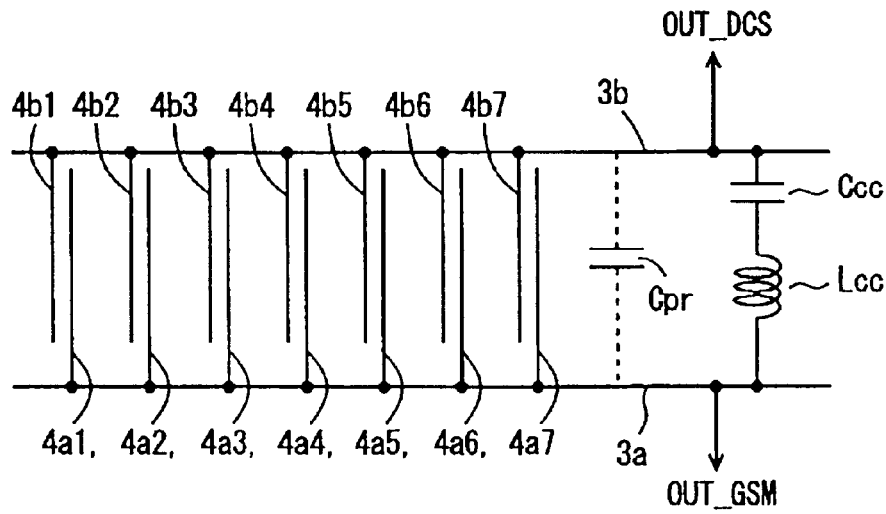
FIG. 6 schematically shows a parasitic capacitance in the FIG. 5 interconnection line layout.

In the lay out of FIG. 5, unit transistor columns C#1–C#7 are each provided with sub collector interconnection lines 4ai and 4bi adjacent with each other, wherein i=1 to 7. Thus, as shown in FIG. 6, as in the layout of the second embodiment, GSM sub collector interconnection lines 4a1–4a7 and DCS and sub collector interconnection lines 4b1–4b are arranged alternately and a so-called inter-digit capacitor is formed between output signal lines 3a and 3b.

Assuming this inter-digit capacitor has a capacitance Cpr, capacitance Cpr and inductance element Lcc are employed together to configure a parallel resonant circuit for a DCS frequency band. Thus, in the GSM operation, the parallel resonant circuit formed by parasitic capacitance Cpr and inductance element Lcc allows a secondary harmonic component of a GSM frequency band to be coupled to DCS output signal line 3b through a substantially infinite impedance to prevent leakage of the secondary harmonic component of the GSM frequency band to DCS output signal line 3b.

Figure 7:
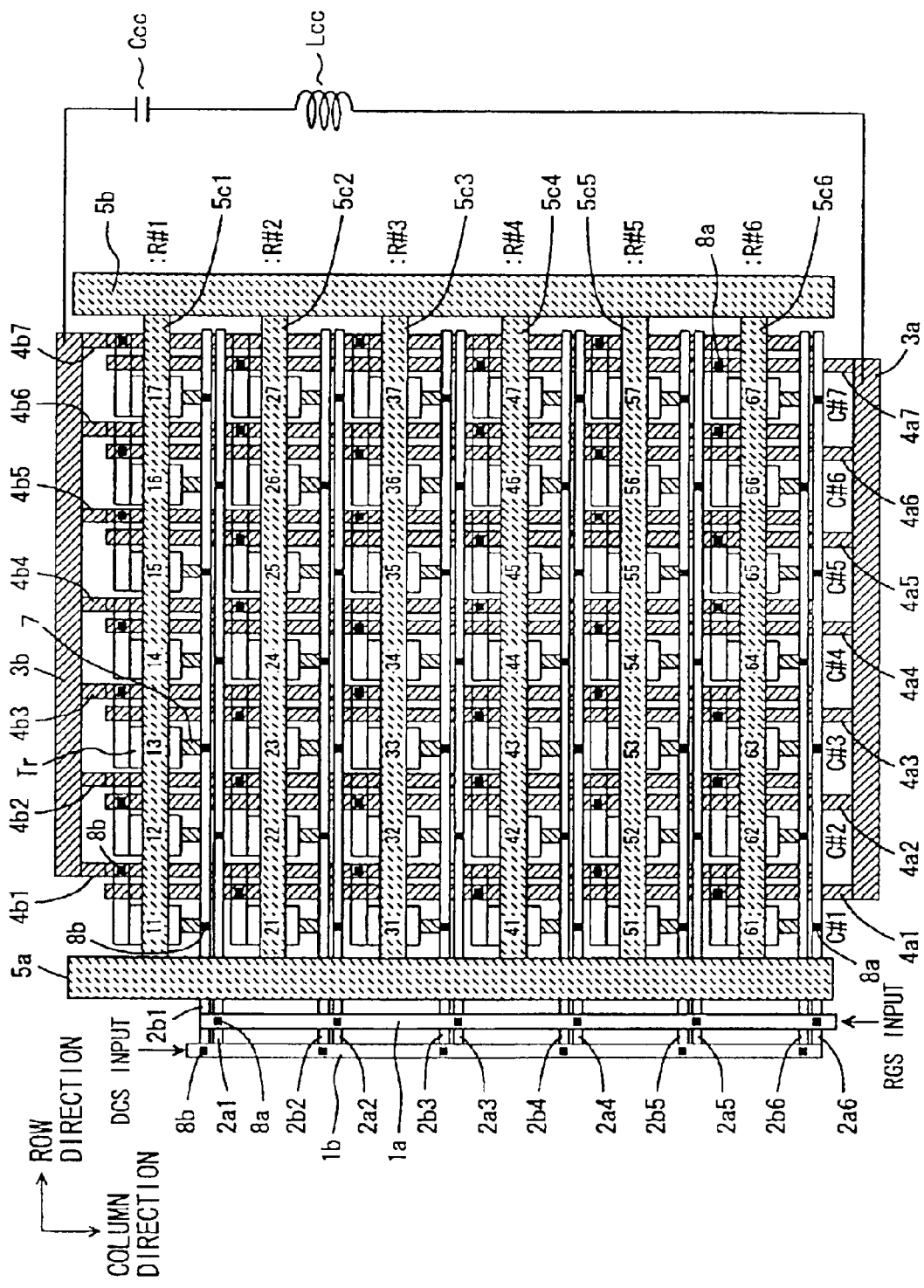
FIG. 7 more specifically illustrates the layout of the unit transistors in accordance with the third embodiment of the present invention.

FIG. 7 schematically shows a layout of unit transistors in accordance with the third embodiment of the present invention. In FIG. 7, as in the unit sell layout as described in the second embodiment referring to FIG. 4, unit transistors Tr are formed in unit cell regions 11–17 to 61–67 arranged in six rows and seven columns.

For unit cell rows R#1–R#6, sub emitter interconnection lines 5c1–5c6 are arranged, respectively. Sub emitter interconnection lines 5c1–5c6 are connected to emitter interconnection lines 5a and 5c arranged, external to the unit cell area, extending in the column direction. Emitter interconnection lines 5a and 5b are coupled to a ground node supplying a ground voltage.

As DCS and GSM unit transistors D and G are arranged alternately in each of unit cell rows R#1–R#6, sub base interconnection lines 2b1–2b6 and 2a1–2a6 are arranged extending in the row direction in unit transistor rows R#1–R#6. Sub base interconnection lines 2a1–2a6 are each connected through through-holes 8a to base ballast resistors 7 connected to the base regions of alternate unit cell regions in the corresponding unit cell rows. Sub base interconnection lines 2b1–2b6 are connected through through-holes 8b to base ballast resistors 7 connected to the base regions of unit cells of the respective unit cell rows.

Sub base interconnection lines 2a1–2a6 are connected through through-holes 8a to a base interconnection line 1a arranged external to the cell array area and extending in the column direction. Sub base interconnection lines 2b1–2b6 are connected through through-holes 8b to a base interconnection line 1b arranged adjacent to base interconnection line 1a and extending in the column direction. Base interconnection line 1a receives a GSM input signal (a signal output from a preceding matching circuit and a base bias control voltage) and base interconnection line 1b receives a DCS input signal (a signal output from a preceding matching circuit and a base bias control voltage).

As this unit cell array region has DCS and GSM unit transistors D and G alternately arranged in both the row direction and the column direction, as for through-holes 8a and 8b, DCS and GSM through-holes 8b and 8a are arranged alternately in the array region in the both of the row direction and the column direction. Sub collector interconnection lines 4a1–4a7 and 4b1–4b7 are arranged in the respective unit cell columns C#1–C#7 extending in the column direction. Sub collector interconnection lines 4a1–4a7 are electrically connected through through-holes 8a to the collector regions of alternate unit cell regions of the corresponding columns. Sub collector interconnection lines 4b1–4b7 are each electrically connected through through-holes 8b to the collector regions of alternate unit cell regions of a corresponding column. Sub collector interconnection lines 4a1–4a7 and 4b1–4b7 are also associated with through-holes 8a and 8b arranged alternately in both of the row direction and the column direction.

Sub collector interconnection lines 4a1–4a7 are commonly connected to collector interconnection line 3a configuring a GSM output signal line, and sub collector interconnection lines 4b1–4b7 are commonly connected to collector interconnection line 3b configuring a DCS output signal line.

Between collector interconnection lines 3a and 3b, capacitance element Ccc for AC short circuit (or for cutting off a direct current) and inductance element Lcc to configure a resonant circuit are connected in series.

In the interconnection layout shown in FIG. 7, not only in the column direction but also in the row direction, DCS and GSM unit transistors D and G are arranged alternately. Accordingly, unit cell rows R#1–R#6 are each associated with the sub base interconnection lines 2a (2a1–2a6) and 2b (2b1–2b6) arranged adjacent to each other, and the area of the unit cell array region is increased by the area occupied by the sub base interconnection lines. However, with the DCS and GSM unit transistors alternately arranged in the row direction, even if unit transistor cell regions are arranged with a minimal pitch, in operation, the unit transistors adjacent in the row and column directions do not operate. Thus, equivalently, inter-unit-cell pitch is increased, heat resistance can sufficiently be reduced, heat can be distributed in the row and column directions, and current concentration due to generated heat can be avoided. Therefore, the transistor cell array can be reduced in area significantly than conventional, since the unit cell pitch can also be reduced in the row direction.

Furthermore, in the present embodiment, as in the second embodiment, a parasitic capacitance of an inter-digit capacitor produced between output signal lines, in conjunction with conductance element Lcc, forms a parallel resonant circuit in a DCS frequency band and can prevent a secondary harmonic component in the GSM operation can be prevented from leaking to DCS output signal line 3b.

As described so far, according to the third embodiment, DCS and GSM unit transistors are alternately arranged in the row and column directions. It can thus reduce thermal resistance of the GSM and DCS unit transistors in the row and column direction without increasing the pitch of the unit cell regions. It can thus efficiently avoid current concentration without substantially increasing the overall size of the final-stage current amplification transistor.

Furthermore, with inductance element Lcc arranged between collector interconnection lines 3a and 3b, a parasitic capacitance between output signal lines 3a and 3b and the inductance element together form a parallel resonant circuit for a DCS frequency band in the GSM operation to prevent a secondary harmonic component of a GSM frequency band from leaking to a DCS signal output circuit to reliably suppress degradation of the inter-band isolation.

It should be noted that the DCS and GSM final-stage power amplification transistors are each formed of the number of unit transistors that is determined appropriately in accordance with required power conditions, respectively.

Fourth Embodiment

Figure 8:
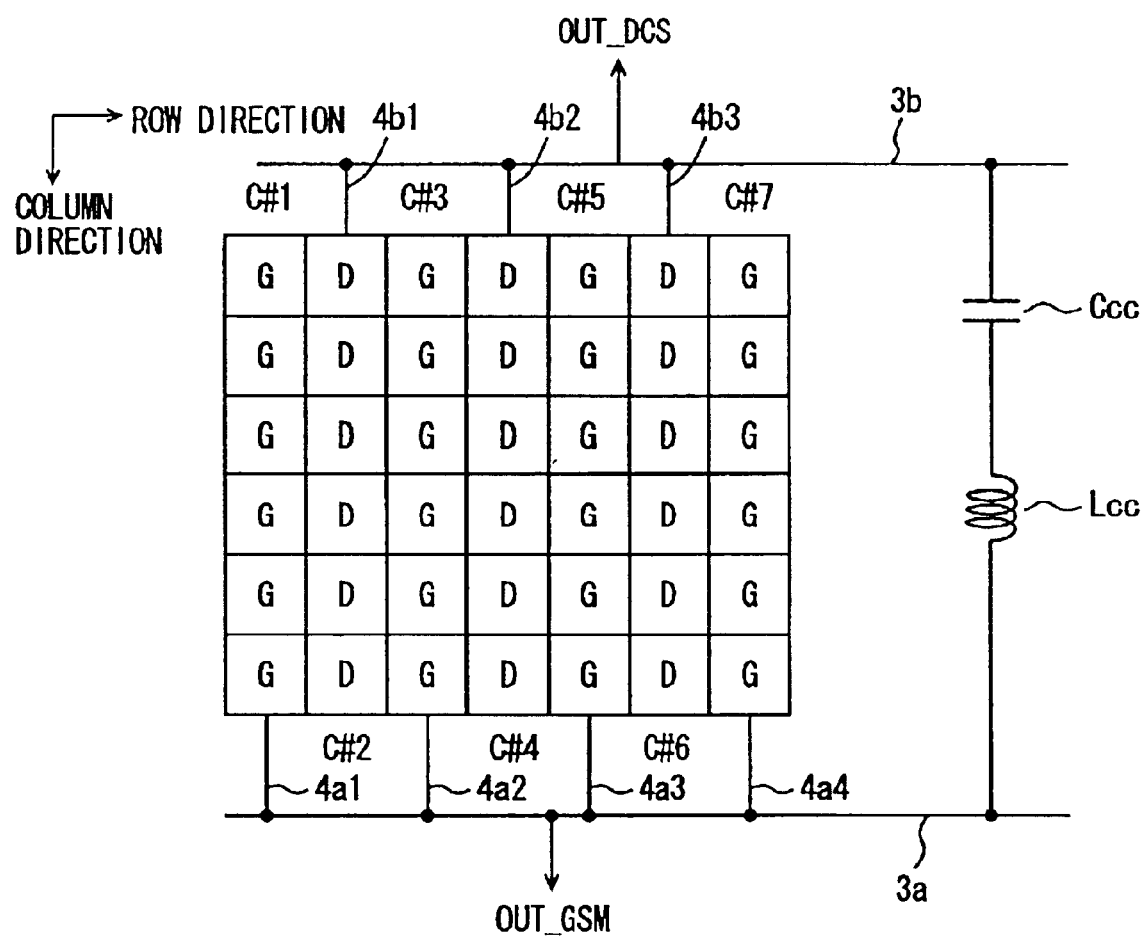
FIG. 8 schematically shows a layout of the unit transistors of the final-stage power amplification transistor in accordance with a fourth embodiment of the present invention.

FIG. 8 schematically shows an arrangement of unit transistors in accordance with a fourth embodiment of the present invention. In FIG. 8, unit transistors are arranged in six rows and seven columns. In the row direction, GCS and DCS unit transistors G and D are arranged alternately. In the column direction, unit transistors of a single kind are arranged in alignment. In FIG. 8, in unit cell columns C#1, C#3, C#5 and C#7, GCS unit transistors Gs are aligned in the column direction, and in unit cell columns C#2, C#4 and C#6, DCS unit transistors Ds are aligned in the column direction.

GSM unit transistors Gs have their collector regions coupled thorough sub collector interconnection lines 4a1–4a4 to collector interconnection line 3a configuring a GSM output signal line. DCS unit transistors Ds have their collector regions interconnected by sub collector interconnection lines 4b1, 4b2 and 4b3 arranged corresponding to unit cell columns C#2, C#4 and C#6, respectively, and also connected to collector interconnection line 3b configuring a DCS output signal line.

Between DCS output signal line or DCS collector interconnection line 3b and GSM output signal line or GSM collector interconnection line 3a, capacitance element Ccc for cutting off a direct current and inductance element Lcc to configure a parallel resonant circuit are connected in series.

In the arrangement of unit transistors shown in FIG. 8, GSM and DCS unit transistors G and D are alternately arranged in the row direction. In operation, either one of GSM and DCS unit transistors G and D only operates, and GSM and DCS unit transistors G and D can thus be arranged with a sufficient pitch in the column direction, heat resistance of these transistors can be reduced in the row direction, and current concentration due to heat generation can thus be prevented.

Furthermore, in unit cell columns C#1 to C#7 GSM and DCS, sub collector interconnection lines 4a1–4a4 and sub collector interconnection lines 4b1–4b3 are arranged alternately. Even in this case, an inter-digit capacitor is formed between output signal lines 3a and 3b. This inter-digit capacitor and inductance element Lcc are employed together to configure a parallel resonant circuit in a DCS frequency band. Accordingly, in the GSM operation, a secondary harmonic component (1800 MHz) of GSM is prevented from leaking through DCS output signal line 3b to a DCS output circuit, and further through the DCS output circuit to an antenna terminal. Thus, deterioration of inter-band isolation can be suppressed.

Figure 9:
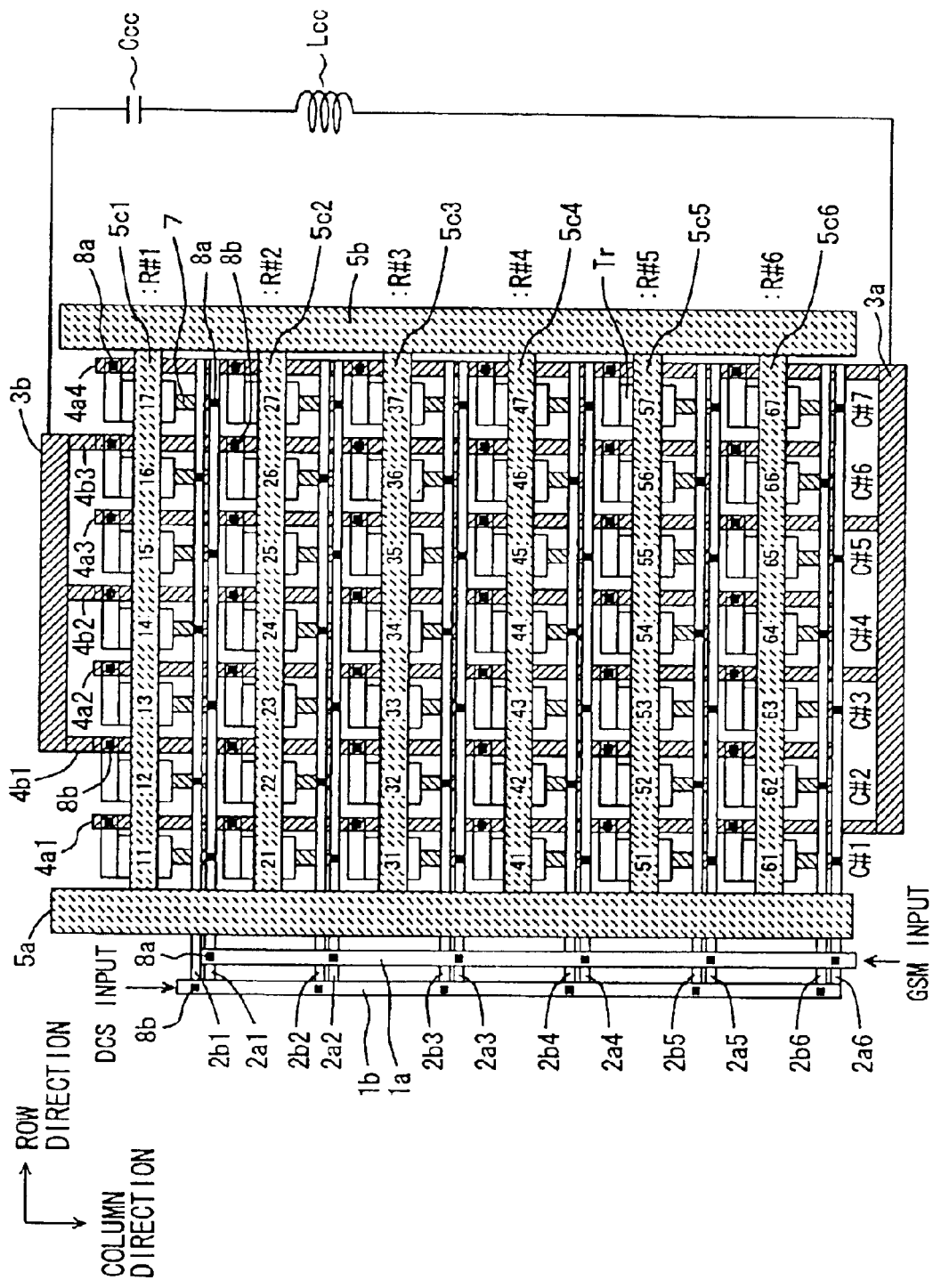
FIG. 9 schematically shows a layout of the unit transistors of the final-stage power amplification transistor in accordance with the fourth embodiment of the present invention.

FIG. 9 shows a more specific arrangement of the layout of unit transistors in accordance with the fourth embodiment. In FIG. 9, unit transistors Trs are formed in unit cell regions 11–17 through 61–67 arranged in six rows and seven columns.

Corresponding to rows of unit cells R#1–R#6, sub emitter interconnection lines 5c1–5c6 are arranged, respectively. Sub emitter interconnection lines 5c1–5c6 are electrically connected to the unit cells at the emitter regions on the respective rows through emitter ballast resistors (not shown) and are also coupled to emitter interconnection lines 5a and 5b arranged external to the cell array area and extending in the column direction.

Furthermore, unit cell rows R#1–R#6 are also provided with respective sub base interconnection lines 2a1, 2b1 to 2a6, 2b6 extending in the row direction. DCS and GSM unit transistors are arranged alternately in the row direction, and therefore, two sub base interconnection lines are arranged in each of unit cell rows R#1–R#6.

In each of unit cell rows R#1–R#6, sub base interconnection lines in a pair of sub base interconnection lines 2a1 and 2b1 to 2a6 and 2b6 are electrically connected alternately to base ballast resistors 7 through through-holes 8a and 8b. Thus, in each of unit cell rows R#1–R#6, for sub base interconnection lines 2a (2a1–2a6) and 2b (2b1–2b6), through-holes 8a and 8b are alternately arranged. In the column direction, through-holes 8a and 8b are formed aligned in each row.

Sub base interconnection lines 2a1–2a6 are commonly coupled through through-holes 8a to base interconnection line 1a provided external to the cell array area and extending in the column direction, and sub base interconnection lines 2b1–2b6 are commonly coupled through through-holes 8b to base interconnection line 1b arranged adjacent to base interconnection line 1a and extending in the column direction.

Base interconnection lines 1a and 1b receive GSM input signal and DCS input signals, respectively.

Sub collector interconnection lines 4a1–4a4 are arranged, corresponding to unit cell columns C#1, C#3, C#5 and C#7, extending in the column direction. Sub collector interconnection lines 4a1–4a4 are electrically connected in the respective unit cell columns to unit cell regions at the collector regions through through-holes 8a. Sub collector interconnection lines 4a1–4a4 are commonly coupled to collector interconnection line 3a configuring the GSM output signal line.

Sub collector interconnection lines 4b1, 4b2 and 4b3 are arranged, corresponding to unit cell columns C#2, C#4 and C#6, extending in the column direction. Sub collector interconnection lines 4b1–4b3 are each electrically connected to unit cell regions at the collector regions through through-holes 8b in a corresponding unit cell column. Sub collector interconnection lines 4b1–4b3 are commonly coupled to collector interconnection line 3b providing the DCS output signal line.

Between collector interconnection lines (output signal lines) 3a and 3b, capacitance element Ccc and inductance element Lcc are connected in series.

In the interconnection line layout show in FIG. 9, unit cell columns C#1–C#7 are each associated with a signal sub collector interconnection line. However, sub collector interconnection lines 4a1–4a4 and 4b1–4b3 are alternately arranged in the row direction, and are simply spaced by a pitch of unit cell regions in the row direction, and they are formed of an interconnection line of a common interconnection line layer. Thus, even if collector interconnection lines 3a and 3b forming the output signal lines are arranged opposite to each other with respect to the unit cell array region, an "inter-digit capacitor" is still formed and, similarly as described in the second and third embodiments, there exists a parasitic capacitance.

If in the GSM operation, a harmonic component is generated through capacitive coupling, the parasitic capacitance and inductance element Lcc configure a parallel resonant circuit, and the impedance between collector interconnection lines 3a and 3b is maximized to prevent signal propagation through capacitive-coupling. Thus, the secondary harmonic component in the GSM operation is prevented from leaking through collector interconnection line 3b to the DCS output circuit.

It should be noted that in the fourth-embodiment, the final-stage DCS and GSM power amplification transistors are configured of different number of unit transistors G and D. The number of unit transistors used has only to be determined appropriately, taking into account each driving power required for the DCS and GSM power amplifiers. Therefore, the final-stage GSM and DCS power amplification transistors each may be configured of the same number of unit transistors. This arrangement can be achieved by additionally providing the unit cell regions forming the unit transistors for the DCS power amplification transistor in the outside area in the row direction in FIG. 9 in alignment in the column direction. According to such arrangement, the unit transistors D configuring the DCS power amplification transistor can be made equal in number to the unit transistors G configuring the GCM power amplification transistor.

As described so far, according to the fourth embodiment, in unit transistor cells arranged in rows and columns, DCS and GSM unit transistors are arranged alternately in the row direction. Thus, DCS and GSM unit transistors D and G can have an increased pitch in the row direction and thermal resistances of the final-stage output transistors can be reduced to avoid current concentration due to heat concentration.

Furthermore, collector interconnection lines interconnecting unit transistors are laid out parallel to each other to separately lead out GSM and DCS output signals. Thus, even if parasitic capacitance exists, connecting, between collector interconnection lines (output signal lines), inductance element Lcc to configure a parallel resonant circuit in a DCS frequency band together with the parasitic capacitance, can prevent a secondary harmonic component in the GSM operation from being transmitted through the DCS output circuit to an antenna terminal to suppress the deterioration of inter-band isolation.

Fifth Embodiment

FIG. 10 schematically shows an arrangement of unit transistors in accordance with a fifth embodiment of the present invention. In FIG. 10, unit transistors are arranged in six rows and seven columns, as described in the second to fourth embodiments. In the array of unit transistors, GSM and DCS unit transistors G and D are arranged in a ring form to alternately surround each other.

More specifically, in the arrangement shown in FIG. 10, at the center of the array of the unit transistor cells, six GSM unit transistors Gs arranged adjacent to each other in a matrix form. These GSM unit transistors Gs are surrounded by DCS unit transistors Ds arranged in a ring form. Furthermore, the DCS unit transistors Ds in a ring form are surrounded by GSM unit transistors Gs arranged in a ring form.

Sub collector interconnection lines 4b1–4b6 and 4a1–4a7 are arranged corresponding to the respective unit transistor columns. Sub collector interconnection lines 4a1–4a7 and 4b1–4b6 are coupled to corresponding unit transistors at the collector regions in corresponding unit transistor columns. Sub collector interconnection lines 4a1–4a7 are commonly coupled to GSM output signal line or collector interconnection line 3a, and sub collector interconnection lines 4b1–4b6 are commonly coupled to DCS output signal line or collector interconnection line 3b. Between GSM output signal line or collector interconnection line 3a and DCS output signal line or collector interconnection line 3b, capacitance element Ccc and inductance element Lcc are connected in series.

As shown in FIGS. 11A and 11B, arranging unit transistors of a single kind in a ring form can suppress generation of a thermal boundary (a boundary of a thermal distribution), as compared to a normal arrangement.

More specifically, with reference to FIG. 11A, if unit transistors Trs are successively arranged and simultaneously operate, a portion outside the unit transistors Trs arranged at opposite ends has a low temperature as it does not include an operating element. Meanwhile, in these simultaneously operating unit transistors Trs, heat propagation is caused due to heat generation. Thus, as shown in FIG. 11B, such a temperature distribution is caused that unit transistor Tr located at the center is highest in temperature whereas an end of the transistor line, or a thermal boundary, is low in temperature. Such a thermal distribution would cause with high probability of current concentration due to heat concentration at the center unit transistor.

Figure 12:
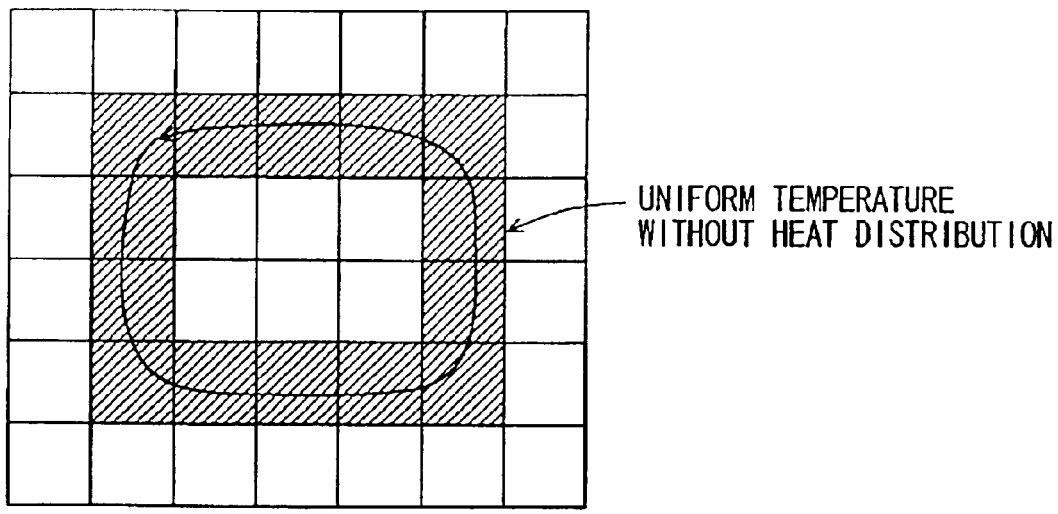
FIG. 12 schematically represents a thermal distribution in the arrangement of unit transistors in FIG. 10.
Figure 14:
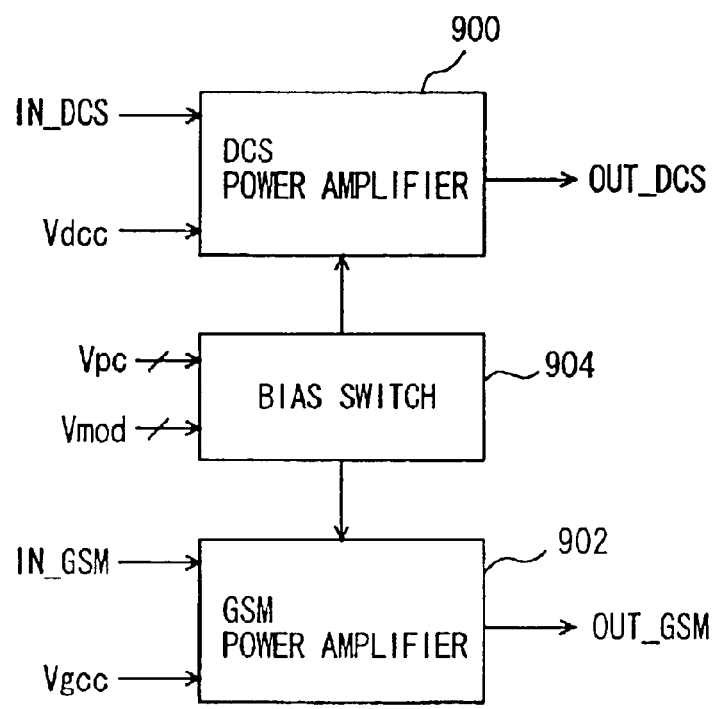
FIG. 14 schematically shows, a configuration of a conventional dualband power amplification circuit.

However, when unit transistors that simultaneously operate are arranged in a ring form, as shown in FIG. 12, the region of these unit transistors can be made free of a thermal boundary and suppress the generation of heat distribution to allow these unit transistors to be simultaneously operated at a uniform temperature to suppress the current concentration due to heat concentration.

Therefore, when unit transistors of a single kind are arranged in the unit cell array, the ends of the array at the four sides of the unit cell array serves as a thermal boundary to cause the thermal distribution in the transistor array, and heat concentration would be more likely to occur at a unit transistor at the center in the array. Arranging simultaneously operating unit transistors in a ring form, as shown in FIG. 10, can eliminate such thermal boundary, make the operating temperature of the unit transistors uniform, and suppress heat concentration.

Furthermore, the region of unit transistors that simultaneously operate is surrounded by unit transistors in an non-operating state, and each unit transistor is thus adjacent to the non-operating unit transistors at least in two directions. Thus, thermal resistance can be reduced, an equivalent pitch of each unit transistor can be increased, to prevent generation of heat concentration.

In the arrangement of FIG. 10, sub collector interconnection lines 4b1–4b6 and 4a1–4a7 are arranged extending in the column direction. Accordingly, in order to prevent capacitive-coupling by the interconnection line capacitance, inductance element Lcc is arranged to configure a parallel resonant circuit in a DCS frequency band. Current concentration can be improved without impairing the inter-band isolation, and different kinds of unit transistors that are arranged in a mixed manner contribute to reduction in chip size.

Figure 13:
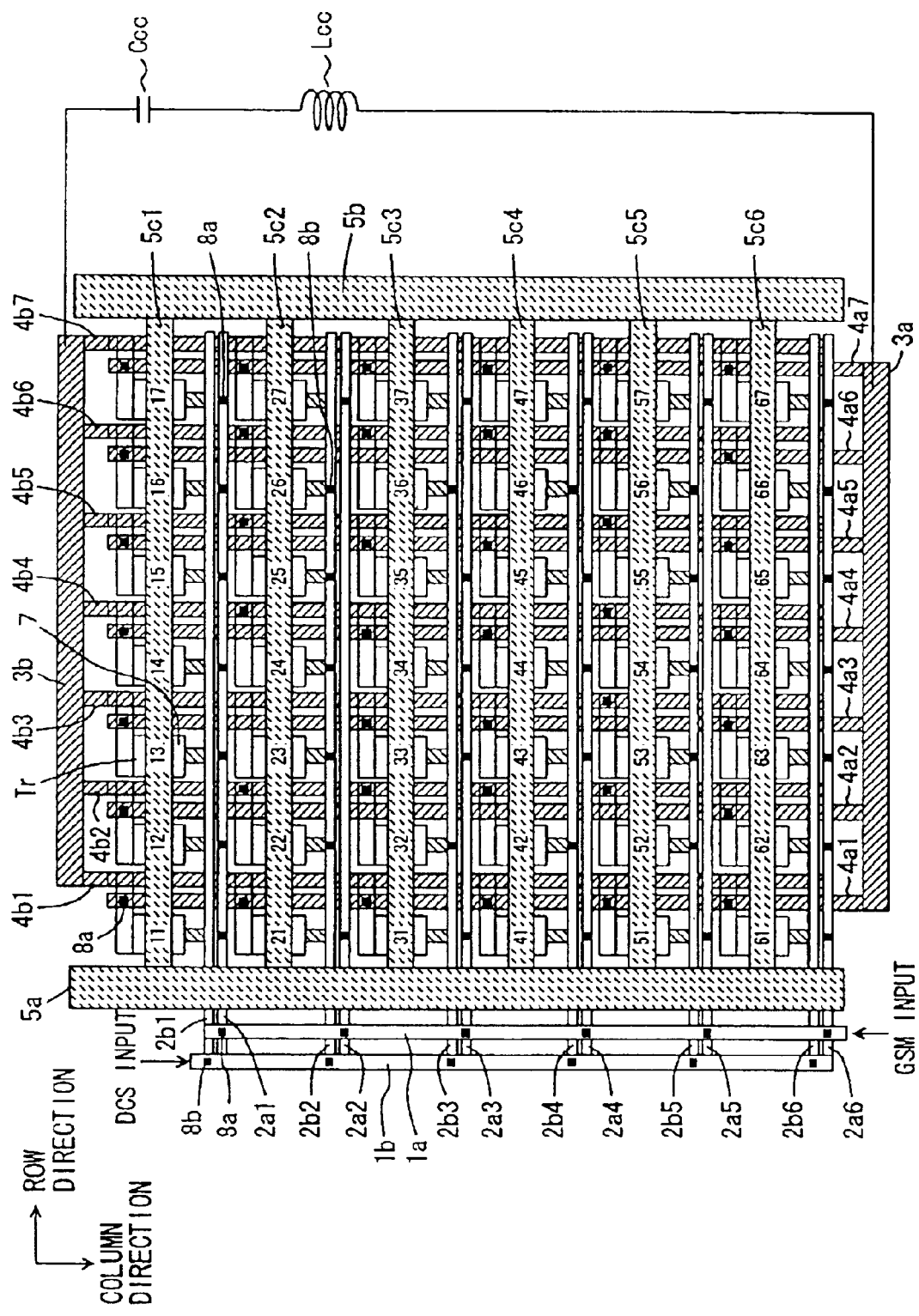
FIG. 13 shows in detail the layout of the unit transistors in accordance with the fifth embodiment of the present invention.
Figure 15:
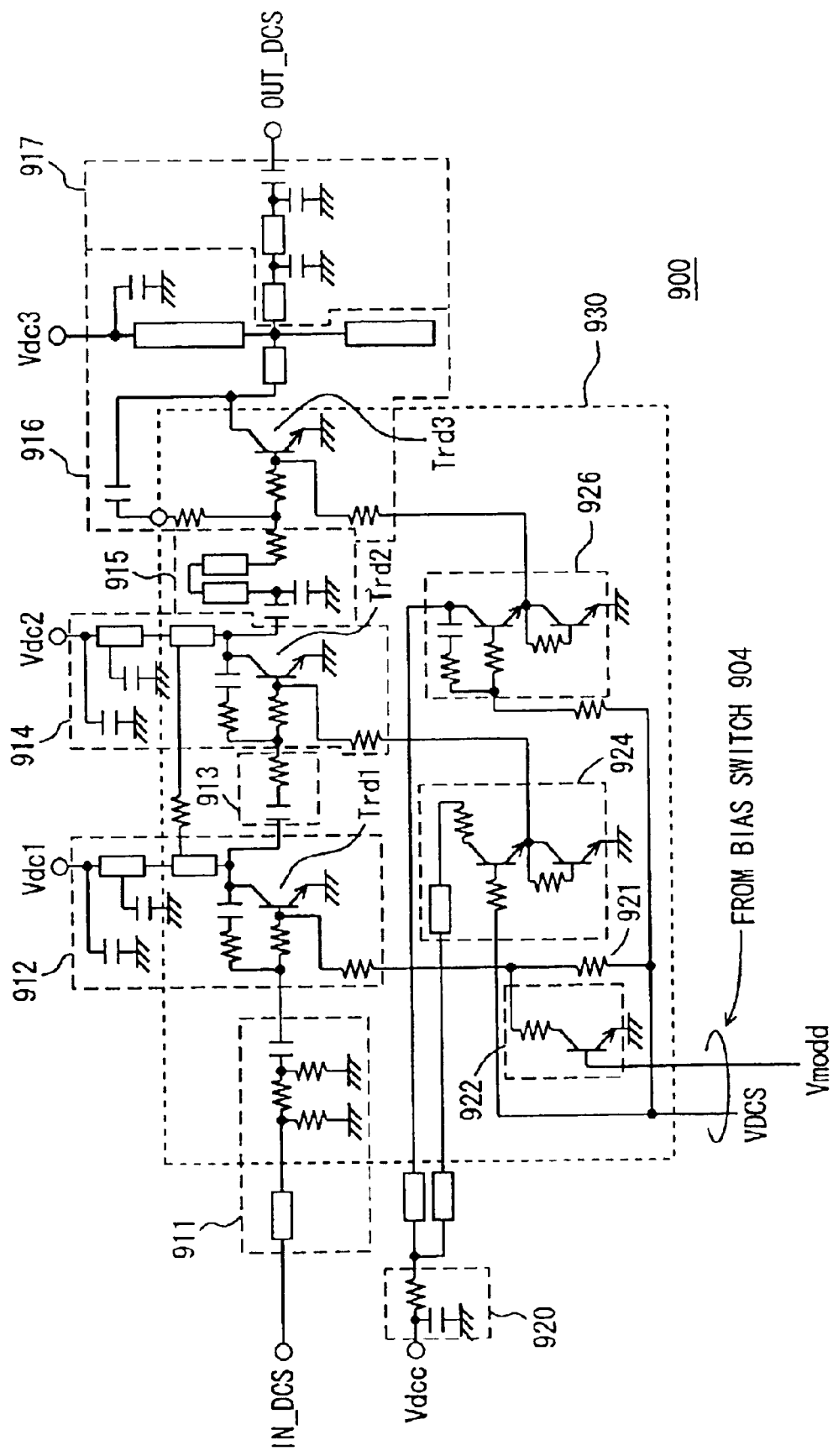
FIG. 15 shows an exemplary circuit configuration of the DCS power amplifier shown in FIG. 14.
Figure 16:
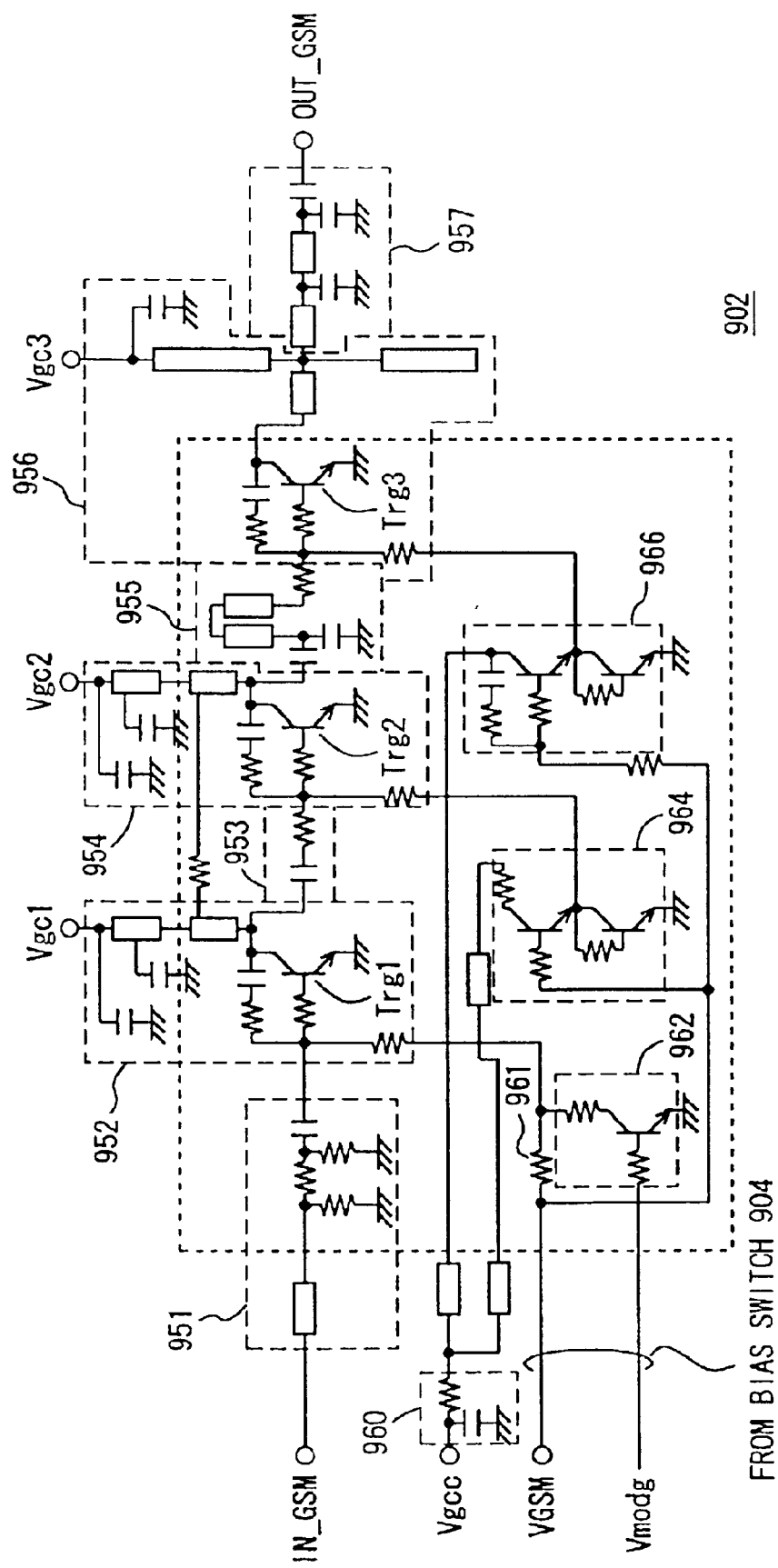
FIG. 16 shows an exemplary circuit configuration of the GSM power amplifier shown in FIG. 14.

FIG. 13 more specifically shows a layout of unit transistors of the final-stage output amplification transistor in accordance with the fifth embodiment of the present invention. In FIG. 13, unit cell regions 11–17 to 61–67 are arranged in sixth rows and seven columns. Corresponding to the unit cell rows, sub base interconnection lines 2a1–2a6 are arranged, respectively, and sub base interconnection lines 2b1–2b6 are arranged, adjacently to sub base interconnection lines 2a1–2a6, respectively, extending in the column direction.

Sub base interconnection lines 2a1–2a6 are commonly connected through through-holes 8a to base interconnection line 1a extending in the column direction. Sub base interconnection lines 2b1–2b6 are commonly connected through through-holes 8b to base interconnection line 1b extending in the column direction.

Corresponding to the unit cell columns, GSM sub collector interconnection lines 4a1–4a7 are arranged extending in the column direction, respectively, and DCS sub collector interconnection lines 4b1–4b7 are arranged, adjacently to sub collector interconnection lines 4a1–4a7, respectively, extending in the column direction.

Corresponding to the unit cell rows, there are arranged sub emitter interconnection lines 5c1–5c6 commonly coupled to emitter interconnection lines 5a and 5b extending in the column direction. Sub emitter interconnection lines 5c1–5c6 are electrically connected to unit cell regions at the emitter regions on corresponding rows through emitter ballast resistors (not shown).

Sub base interconnection lines 2a1–2a6 and 2b1–2b6 and sub collector interconnection lines 4a1–4a6 and 4b1–4b6 are electrically connected through through-holes 8a and 8b, respectively, to base and collector regions of corresponding unit cell regions such that GSM and DCS unit transistors are so arranged in a ring form as to surround each other. More specifically, in unit cell regions 11–17, base ballast resistors 7 are connected through through-holes 8a to sub base interconnection line 2h and the respective collector regions are connected through through-holes 8a to sub collector interconnection lines 4a1–4a7.

In the second row, unit cell regions 21 and 27 have the respective base regions electrically connected to sub base interconnection line 2a2 via base ballast resistors and through through-holes 8a and the respective collector regions electrically connected to sub collector interconnection lines 4a1 and 4a7 through through-holes 8a. Unit cell regions 22–26 have their base regions electrically connected to sub base interconnection line 2b2 via base ballast resistors and through through-holes 8b and their collector regions electrically connected through through-holes 8b to sub collector interconnection lines 4b2–4b6.

In the third row, unit cell regions 31, 33–35 and 37 have their base regions electrically connected to sub base interconnection line 2a3 via base ballast resistors and through through-holes 8a and the respective collector regions electrically connected through through-holes 8a to sub collector interconnection lines 4a1, 4a3–4a5 and 4a7. Unit cell regions 32 and 36 have their base regions electrically connected to sub base interconnection line 2b3 via base ballast resistors and through through-holes 8b and the respective collector regions electrically connected through through-holes 8b to sub collector interconnection lines 4b2 and 4b6.

In the fourth row, as in the third row, unit cell regions 41, 43–45 and 47 have their base regions electrically connected to sub base interconnection line 2a4 via base ballast resistors and through through-holes 8a and have the respective collector regions electrically connected through through-holes 8a to sub collector interconnection lines 4a1, 4a3–4a5 and 4a7. Unit cell regions 42 and 46 have their base regions electrically connected to sub base interconnection line 2b4 via base ballast resistors and through through-holes 8b and have the respective collector regions electrically connected through through-holes 8b to sub collector interconnection lines 4b2 and 4b6.

In the fifth row, unit cell regions 51 and 57 have their base regions electrically connected to sub base interconnection line 2a5 via base ballast resistors and through through-holes 8a and the respective collector regions electrically connected through through-holes 8a to sub collector interconnection lines 4a1 and 4a7. Unit cell regions 52–56 have their base regions electrically connected to sub base interconnection line 2b5 via base ballast resistors 7 and through through-holes 8b and the respective collector regions electrically connected through through-holes 8b to sub collector interconnection lines 4b2–4b6.

In the sixth row, cell regions 61–67 have their base regions electrically connected to sub base interconnection line 2a6 via base ballast resistors and through through-holes 8a and the respective collector regions connected through through-holes 8a to sub collector interconnection lines 4a1–4a7.

Thus, as shown in FIG. 13, according to the arrangement that unit cell regions are arranged in a matrix of rows and columns, sub-emitter and sub-base interconnection lines are arranged corresponding to each row and each column is provided with a sub collector interconnection line, DCS and GSM unit transistors can be arranged in a multi-ring form simply by changing their contact positions.

Note that if in the arrangement of unit transistor cells shown in FIGS. 10 and 13, an isolator is provided to achieve inter-band isolation, as is done in PDC or others, it is not particularly required to arrange the conductance element Lcc for forming a parallel resonance circuit.

The arrangement of unit transistor cells of FIGS. 11 and 13 can also contain the number of unit transistors that is determined appropriately to correspond to power output required for each of GSM and DCS power amplification transistors.

As described so far, according to the fifth embodiment, GSM and DCS unit transistors are arranged in an array of unit cells in the form of rings to surround each other. Thus, current concentration can be avoided and chip size can be reduced without increasing a pitch of the unit cell regions for forming unit transistors.

Furthermore, even when DCS and GSM sub collector interconnection lines are arranged adjacent to each other, an inductance element is arranged to configure a parallel resonance circuit in a DCS frequency band, and a secondary harmonic components in the GSM operation can be prevented from leaking to an output node of the DCS power amplifier to be transmitted through a DCS output circuit to an antenna, and inter-band isolation impairing can be sufficiently suppressed Other Applications In the above description, an HBT is indicated as a component of the power amplification transistor. However, a similar effect can also be achieved by applying the present invention to a power amplifier including an insulated gate field effect transistor, such as a MOSFET or a MESFET, as a component thereof, other than the HBT.

Furthermore, in the above description, a dual band power amplifier is described as a GSM/DCS power amplifier. However, the communication system is not limited to such communication system and the present invention is applicable to any multi-band power amplification circuit amplifying a signal of a plurality of different frequency bands from each other.

Furthermore, when a parallel resonance circuit is arranged, the present invention is applicable to any configuration for a dual band frequency band as far as one frequency band is accompanied by a harmonic component included in a component of the other frequency band.

Furthermore, the present invention is generally applicable to a multi-band power amplifier amplifying the power of a signal of a plurality of frequency bands.

As described heretofore, according to the present invention, unit transistor cells of the final-stage power amplification transistors of a multi-band power amplifier are arranged dispersedly in a unit cell array area. Thus, the thermal resistance of the power amplification transistors can be reduced to Furthermore, even when output signal lines are arranged adjacent to each other in order to lead out each signal in the multi-bands separately, an inductance element is arranged between the output signal lines, and in an operation outputting a signal of one band, a harmonic component of the one band can be prevented from leaking to the output signal line of other band through capacitive-coupling, and thus reduced impairing of inter-band isolation can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier comprising:
   a first output transistor, including a plurality of first unit transistor cells, for outputting a signal of a first frequency band;
   a second output transistor, including a plurality of second unit transistor cells, for outputting a signal of a second frequency band different from said first frequency band; and
   an inductance element arranged between an output node of said first output transistor and an output node of said second output transistor.

2. The amplifier according to claim 1, wherein the first and second output transistors include at least one portion having a single second unit transistor cell formed between two first unit transistor cells aligned in a given direction.

3. The amplifier according to claim 1, further comprising a capacitance element connected in series to said inductance element between the output node of said first output transistor and the output node of said second output transistor.

4. The amplifier according to claim 2, wherein the first and second unit transistor cells are alternately arranged in at least one of a first direction and a second direction orthogonal to said first direction.

5. The amplifier according to claim 2, wherein the first and second unit transistor cells are alternately arranged in a first direction and in a second direction orthogonal to said first direction.

6. The amplifier according to claim 2, wherein the first and second unit transistor cells are arranged in groups surrounding each other alternately.

7. The amplifier according to claim 1, wherein:
   said plurality of first unit transistor cells and said plurality of second unit transistor cells are aligned in a first direction and a second direction orthogonal to said first direction and each include first and second conduction nodes and a control node;
   said first output transistor further includes
   a plurality of first interconnection lines arranged extending in said first direction and electrically interconnecting the first conduction nodes of said plurality of first unit transistor cells,
   a plurality of second interconnection lines arranged extending in said second direction and electrically interconnecting the second conduction nodes of said plurality of first unit transistor cells,
   a plurality of third interconnection lines arranged extending in said second direction and electrically interconnecting the control nodes of the first unit transistor cells, and
   a fourth interconnection line arranged extending in said second direction and electrically connected to the first interconnection lines to form the output node of said first output transistor;
   said second output transistor further includes
   a fifth interconnection line arranged extending in said first direction and arranged in said second direction alternately with the first interconnection lines, and electrically interconnecting the first conduction nodes of the second unit transistor cells,
   a plurality of sixth interconnection lines arranged extending in said second direction in common to the second interconnection lines, and electrically interconnecting the second conduction nodes of the second unit transistor cells,
   a plurality of seventh interconnection lines arranged extending in said second direction and alternately in said first direction with the third interconnection lines, and electrically interconnecting the control nodes of the second unit transistor cells, and
   an eighth interconnection line arranged extending in said second direction opposite to said fourth interconnection line, and electrically interconnected to the fifth interconnection lines to form the output node of said second output transistor;
   the second and sixth interconnection lines are interconnected to a reference voltage line transmitting a predetermined voltage; and
   the first and fifth interconnection lines are connected to corresponding unit transistor cells alternately in at least one of the first and second directions.

8. The amplifier according to claim 7, wherein the first and fifth interconnection lines are arranged corresponding to the respective columns of unit transistor cells aligned in said first direction.

9. The amplifier according to claim 1, wherein said first frequency band includes a frequency component of an integer multiple of a frequency component of said second frequency band.

10. An amplifier comprising:
    a first output transistor having a plurality of unit transistor cells, for outputting a signal of a first frequency band; and
    a second output transistor having a plurality of second unit transistor cells arranged such that the first unit transistors and the second transistors surround alternately with each other, for outputting a signal of a second frequency band.

11. The amplifier according to claim 10, wherein:
    said plurality of first unit transistor cells and said plurality of second unit transistor cells are arranged in alignment in both a first direction and a second direction orthogonal to said first direction and each include first and second conduction nodes and a control node;

said first output transistor further includes a plurality of first interconnection lines arranged extending in said first direction and electrically interconnecting the first conduction nodes of said plurality of first unit transistor cells, a plurality of second interconnection lines arranged extending in said second direction and electrically interconnecting the second conduction nodes of said plurality of first unit transistor cells, a plurality of third interconnection lines extending in said second direction and electrically interconnecting the control nodes of said first unit transistor cells, and a fourth interconnection line, arranged extending in said second direction and electrically connected to the first interconnection lines, to form an output node of said first output transistor;

said second output transistor further includes a plurality of fifth interconnection lines arranged extending in said first direction and arranged in said second direction alternately with the first interconnection lines, and electrically interconnecting the first conduction nodes of said plurality of second unit transistor cells, a plurality of sixth interconnection lines arranged extending in said second direction commonly to the second interconnection lines, and electrically interconnecting the second conduction nodes of said plurality of second unit transistor cells, a plurality of seventh interconnection lines arranged extending in said second direction and alternately with said plurality of third interconnection lines in said first direction, and electrically interconnecting the control nodes of said plurality of second unit transistor cells, and an eighth interconnection line arranged extending in said second direction oppositely to said fourth interconnection line with respect to formation region for forming the first and second unit transistor cells, and electrically interconnected to the fifth interconnection lines, to form an output node of said second transistor;

the second and sixth interconnection lines are interconnected to a reference voltage line transmitting a predetermined voltage; and the first and fifth interconnection lines connect to corresponding unit transistors such that the first and second unit transistor cells surround in group alternately with each other.

12. The amplifier according to claim 10, wherein said first frequency band includes a frequency component of an integer multiple of a frequency component of said second frequency band.

* * * * *